(12) United States Patent
Oki et al.

(10) Patent No.: US 8,442,079 B2
(45) Date of Patent: May 14, 2013

(54) MODE-LOCKED SEMICONDUCTOR LASER DEVICE AND DRIVING METHOD THEREOF

(75) Inventors: Tomoyuki Oki, Kanagawa (JP); Masaru Kuramoto, Kanagawa (JP); Masao Ikeda, Kanagawa (JP); Takao Miyajima, Kanagawa (JP); Hideki Watanabe, Kanagawa (JP); Hiroyuki Yokoyama, Miyagi (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 123 days.

(21) Appl. No.: 13/035,540

(22) Filed: Feb. 25, 2011

(65) Prior Publication Data

US 2011/0216788 A1  Sep. 8, 2011

(30) Foreign Application Priority Data

Mar. 5, 2010 (JP) ................ P2010-049749

(51) Int. Cl.
*H01S 3/098* (2006.01)
(52) U.S. Cl. ............. 372/18; 372/45.013; 372/46.01
(58) Field of Classification Search ........ 372/18
See application file for complete search history.

(56) References Cited

U.S. PATENT DOCUMENTS

| | | | | |
|---|---|---|---|---|
| 6,266,351 | B1 * | 7/2001 | Burkhard et al. | 372/32 |
| 7,199,398 | B2 * | 4/2007 | Ono et al. | 257/66 |
| 2004/0264533 | A1 * | 12/2004 | Matsumura et al. | 372/45 |
| 2007/0258496 | A1 * | 11/2007 | Miyajima et al. | 372/45.01 |
| 2008/0069162 | A1 * | 3/2008 | Toda et al. | 372/45.011 |

FOREIGN PATENT DOCUMENTS

| | | |
|---|---|---|
| JP | 2004-007002 | 1/2004 |
| JP | 2004-087903 | 3/2004 |
| JP | 2004-188678 | 7/2004 |
| JP | 2005-057308 | 3/2005 |
| JP | 2008-047692 | 2/2008 |
| JP | 2010-040388 | 2/2010 |
| JP | 2011-023406 | 2/2011 |

OTHER PUBLICATIONS

Hiroyuki Yokoyama et al., "Generation of Subpicosecond Coherent Optical Pulses by Passive Mode Locking of an AlgaAs Diode Laser", Appl. Phys. Lett. 40, Jan. 15, 1982, pp. 105-107, 1982 American Institute of Physics.

S. Gee et al., "Ultraviolet Picosecond Optical Pulse Generation from a Mode-Locked InGaN Laser Diode", Applied Physics Letters, Sep. 24, 2001, pp. 1951-1952, vol. 79, No. 13.

* cited by examiner

*Primary Examiner* — Xinning Niu
(74) *Attorney, Agent, or Firm* — K&L Gates LLP

(57) ABSTRACT

Provided is a driving method of a mode-locked semiconductor laser device comprising a laminated structure in which a first compound semiconductor layer, a third compound semiconductor layer having an emission region and a second compound semiconductor layer are successively laminated, a second electrode, and a first electrode. The laminated structure is formed on a compound semiconductor substrate having polarity, the third compound semiconductor layer includes a quantum well structure having a well layer and a barrier layer. The well layer has a depth of 1 nm or more and 10 nm or less. The barrier layer has an impurity doping density of $2\times10^{18}$ $cm^{-3}$ or more and $1\times10^{20}$ $cm^{-3}$ or less. An optical pulse is generated in the emission region by passing a current from the second electrode to the first electrode via the laminated structure.

10 Claims, 16 Drawing Sheets

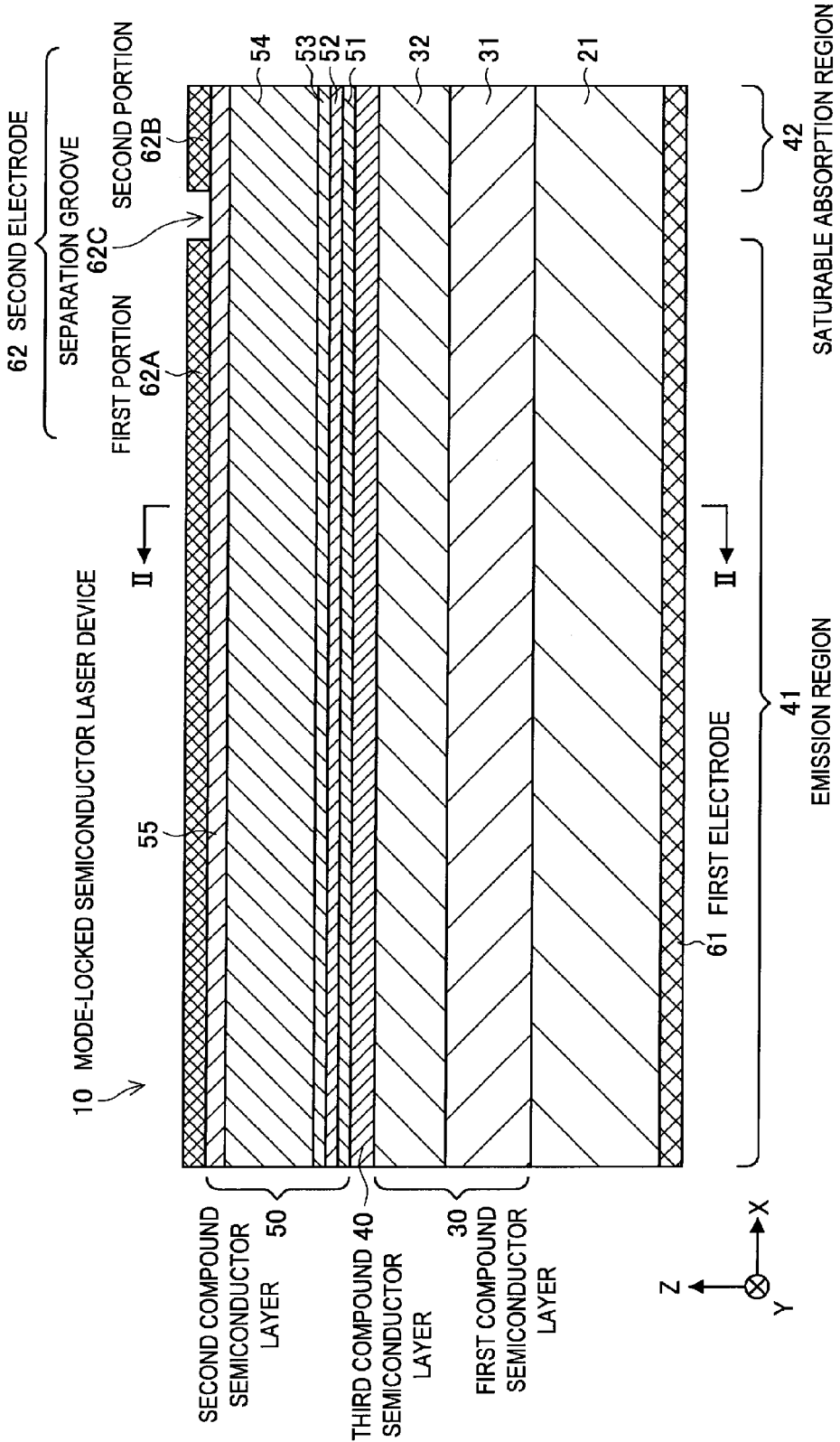

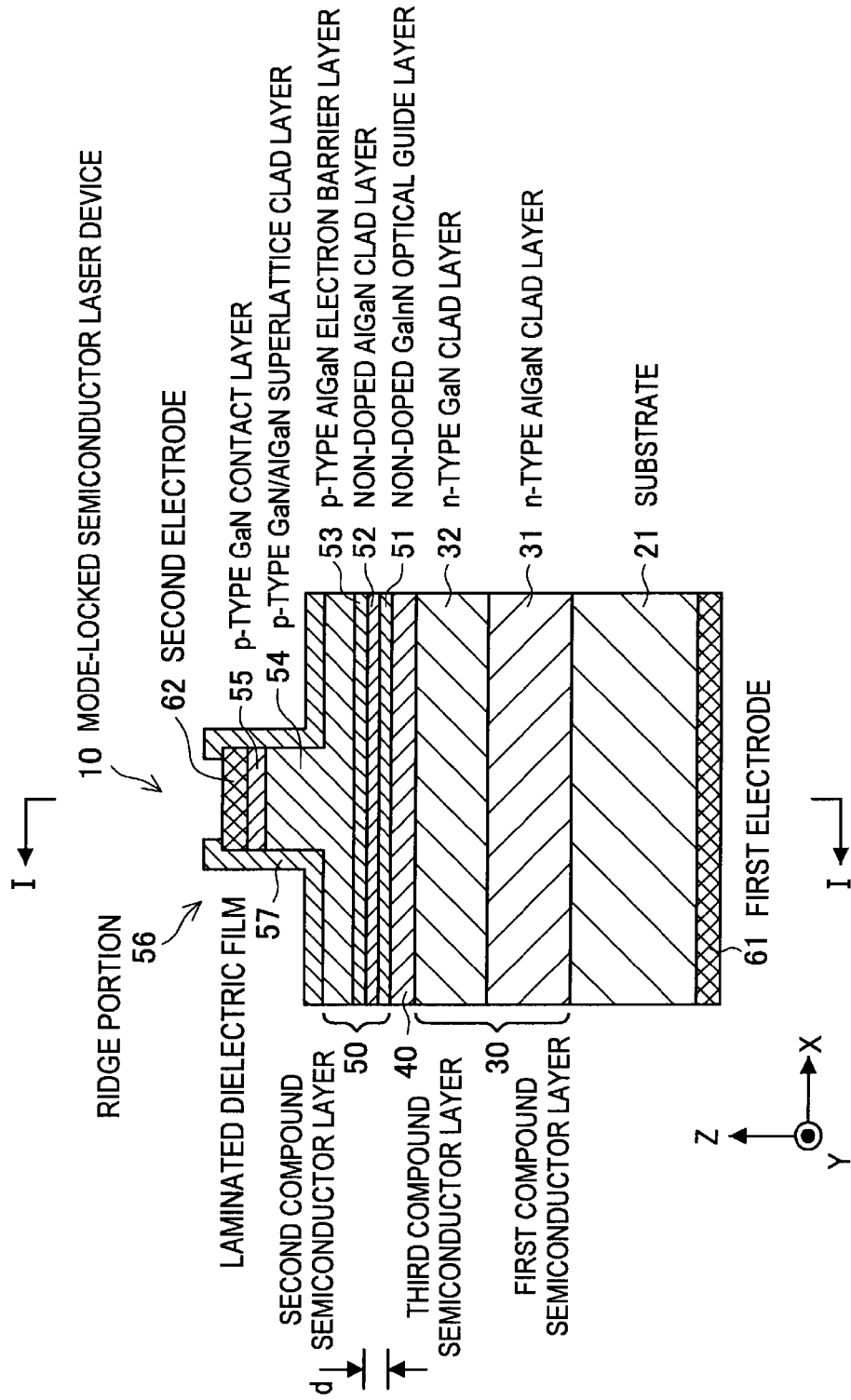

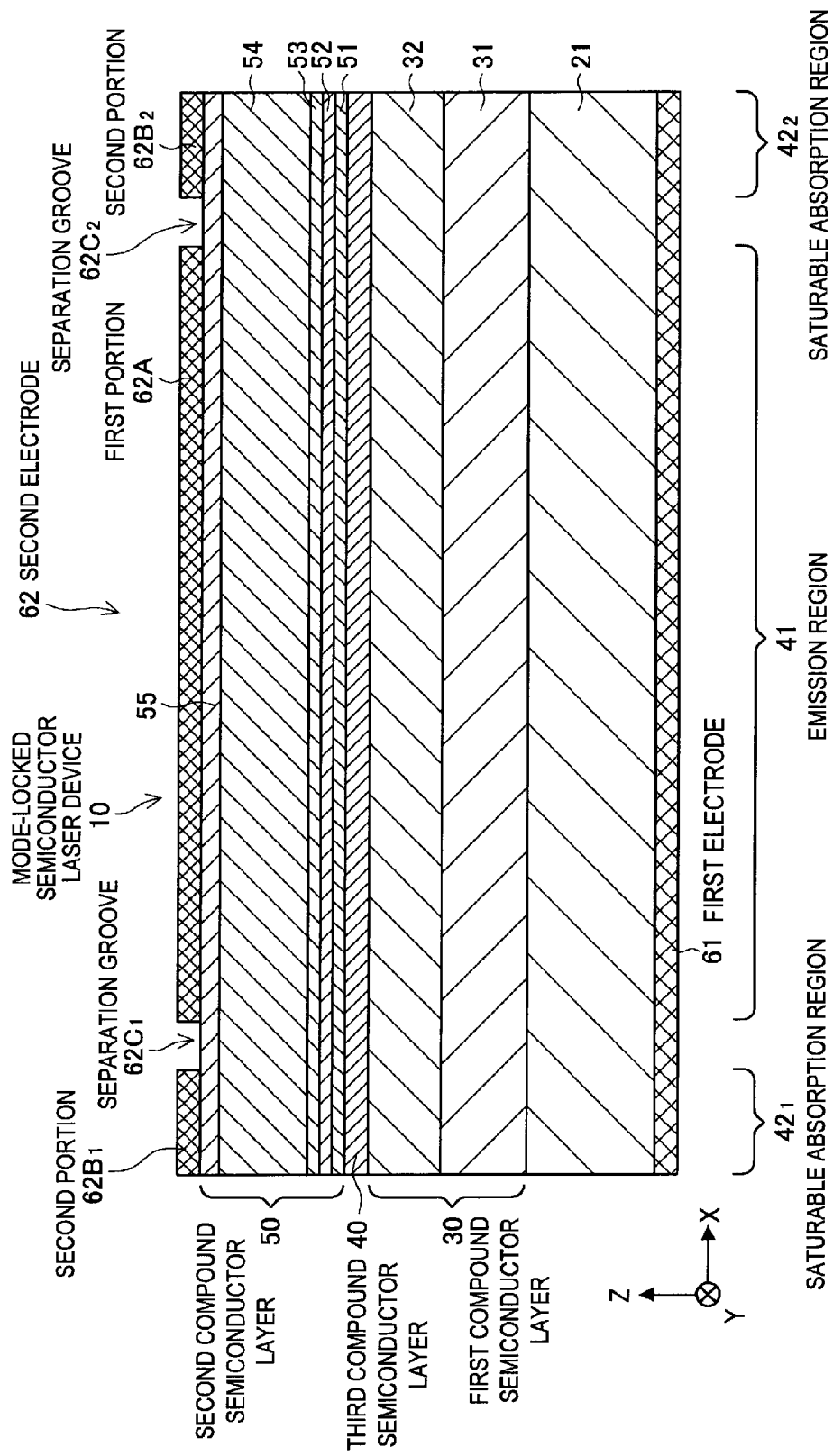

[PROCESS-130]

MODE-LOCKED SEMICONDUCTOR LASER DEVICE AND DRIVING METHOD THEREOF

CROSS REFERENCES TO RELATED APPLICATIONS

The present application claims priority to Japanese Patent Application JP 2010-049749 filed on Mar. 5, 2010, the entire contents of which is hereby incorporated by reference.

BACKGROUND

The present disclosure relates to a mode-locked semiconductor laser device and a driving method thereof.

Ultrashort pulse/ultrahigh output lasers are actively used for research in advanced scientific fields using laser light whose pulse time is in attosecond or femtosecond. Moreover, a high output ultrashort pulse semiconductor laser device composed of GaN-base compound semiconductor and whose luminous wavelength is in the 405 nm band is expected as a light source of a volume type optical disk system expected as a next-generation optical disk system after the Blu-ray optical disk system and also as a light source demanded from the medical field, bio-imaging field and the like.

A titanium/sapphire laser, for example, is known as an ultrashort pulse/ultrahigh output laser, but the titanium/sapphire laser is an expensive large solid-state laser light source, which constitutes a main factor inhibiting widespread use of the technology. Realization of the ultrashort pulse/ultrahigh output laser by a semiconductor laser or a semiconductor laser device will cause significant miniaturization, cost reduction, and high-level stabilization and is considered to be a breakthrough to promote widespread use thereof in these fields.

On the other hand, research on shorter pulses of a semiconductor laser device has actively been done in the field of communications systems since the 1960s. The gain switching, the loss switching (Q switching), and the mode locking are known as methods of causing a semiconductor laser device to generate shorter pulses and these methods aim for higher output by combining the semiconductor laser device with a semiconductor amplifier, nonlinear optical element, optical fiber or the like. The mode locking is further divided into active mode locking and passive mode locking. To generate an optical pulse based on the active mode locking, an external resonator is constructed using mirrors and lenses and further radio frequency (RF) modulation is applied to the semiconductor laser device. For the passive mode locking, on the other hand, an optical pulse may be generated by simple DC driving using a semiconductor laser device having a multi-electrode structure.

It is necessary to provide emission regions and saturable absorption regions in a semiconductor laser device to cause a self-pulsation operation of the semiconductor laser device. Based on an arrangement state of emission regions and saturable absorption regions, the semiconductor laser device may be classified into a SAL (Saturable Absorber Layer) type or WI (Weakly Index guide) type in which emission regions and saturable absorption regions are arranged in a vertical direction and a multi-electrode type including a bi-section type in which emission regions and saturable absorption regions are arranged in a resonator direction. A bi-section type semiconductor laser device is known from Japanese Patent Application Laid-Open Nos. 2004-007002, 2004-188678, and 2008-047692. Compared with a SAL type semiconductor laser device, a multi-electrode type GaN base semiconductor laser device has a larger effect of saturable absorption and is considered to be able to generate optical pulses whose width is narrow.

SUMMARY

Incidentally, when the mode locking is applied, a cubic system (mainly GaAs base) semiconductor laser device has been confirmed to be able to generate an optical pulse whose time width is 0.6 picosecond (see H. Yokoyama, et al: Appl. Phys. Lett. 39 (1981) 525). In 2001, using a hexagonal system (mainly GaN base) semiconductor laser device, S. Gee and his colleague reported the generation of an optical pulse using the mode locking (see S. Gee and E. Bowers: Appl. Phys. Lett. 79 (2001) 1951). However, according to S. Gee and E. Bowers: Appl. Phys. Lett. 79 (2001) 1951, the time width of an optical pulse is 30 picosecond and too long.

If a multi-electrode type semiconductor laser device is produced by using a substrate having polarity, more specifically, for example, if a multi-electrode type GaN base semiconductor laser device is provided on a {0001} plane (C plane) of a GaN substrate, it may become difficult to electrically control saturable absorption due to the QCSE effect (quantum locked-in Stark effect) caused by an internal field originating from piezo polarization or spontaneous polarization. That is, it has become clear that in some cases, it is necessary to increase the value of DC current passed to a first electrode and the value of reverse bias voltage applied to saturable absorption regions to obtain a self-pulsation operation and mode locking operation, a sub-pulse component accompanying a main pulse arises, or it becomes difficult to synchronize an external signal and an optical pulse.

Therefore, it is desirable to provide a mode-locked semiconductor laser device configured to be able to reduce the effect of piezo polarization and a driving method thereof.

According to an embodiment, there is provided a driving method of a mode-locked semiconductor laser device comprising:

(a) a laminated structure in which a first compound semiconductor layer having a first conductive type and composed of a GaN base compound semiconductor, a third compound semiconductor layer having an emission region composed of the GaN base compound semiconductor, and a second compound semiconductor layer having a second conductive that is different from the first conductive type and composed of the GaN base compound semiconductor are successively laminated;

(b) a second electrode formed on the second compound semiconductor layer; and (c) a first electrode electrically connected to the first compound semiconductor layer, wherein the laminated structure is formed on a compound semiconductor substrate having polarity, the third compound semiconductor layer includes a quantum well structure having a well layer and a barrier layer, the well layer has a depth of 1 nm or more and 10 nm or less, the barrier layer has an impurity doping density of $2 \times 10^{18}$ $cm^{-3}$ or more and $1 \times 10^{20}$ $cm^{-3}$ or less, and an optical pulse is generated in the emission region by passing a current from the second electrode to the first electrode via the laminated structure.

In a driving method of a mode-locked semiconductor laser device in the present invention, an optical pulse is generated in emission regions by passing a current from the second electrode to the first electrode via a laminated structure. In a mode-locked semiconductor laser device in the present invention, an optical pulse develops in emission regions by a current being passed from the second electrode to the first electrode via a laminated structure.

A mode-locked semiconductor laser device in the present embodiment or a driving method thereof is specified that a well layer constituting a third compound semiconductor layer has a thickness of 1 nm or more and 10 nm or less and further, barrier layer constituting the third compound semiconductor layer has an impurity doping density of $2\times10^{18}$ cm$^{-3}$ or more and $1\times10^{20}$ cm$^{-3}$ or less. That is, the thickness of the well layer is made thinner and also an attempt is made to increase carriers in the third compound semiconductor layer. As a result, an influence of piezo polarization may be reduced so that a laser light source capable of generating an optical pulse whose time width is short and having less sub-pulse components to create a more or less single peak. Moreover, mode-locked driving may be achieved at a lower reverse bias voltage and an optical pulse train synchronized with an external signal (an electric signal or an optical signal) may be generated. Therefore, for example, the mode-locked semiconductor laser device may be applied to an oscillator that generates an optical pulse in a volume type optical disk system.

Additional features and advantages are described herein, and will be apparent from the following Detailed Description and the figures.

BRIEF DESCRIPTION OF THE FIGURES

FIG. 1 is a schematic end face view along a direction in which a resonator of a mode-locked semiconductor laser device of Example 1 extends;

FIG. 2 is a schematic sectional view along the direction perpendicular to the direction in which the resonator of the mode-locked semiconductor laser device of Example 1 extends;

FIG. 7 is a schematic sectional view along the direction in which a modified resonator of the mode-locked semiconductor laser device of Example 1 extends;

DETAILED DESCRIPTION

Figure 3A:
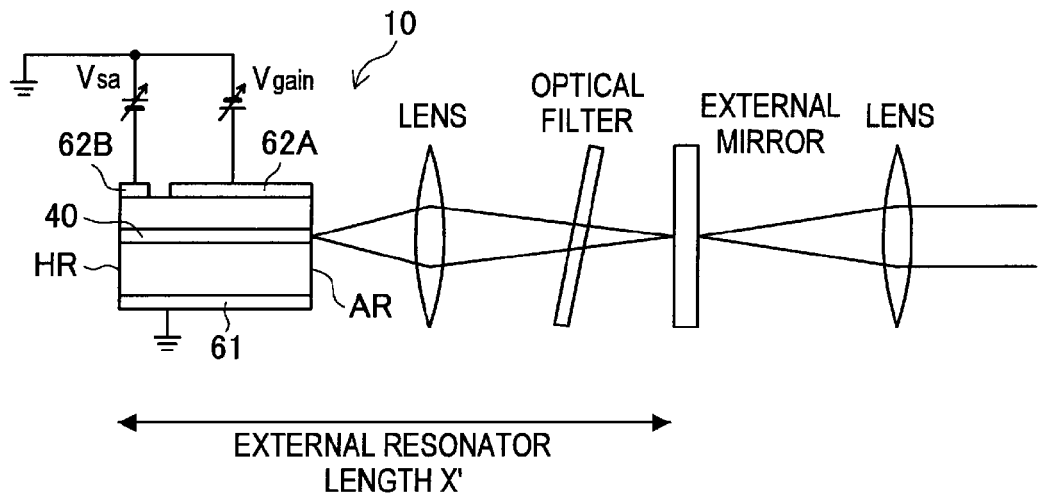
FIG. 3A is a diagram schematically showing a system that carries out mode-locked driving by constituting an external resonator from the mode-locked semiconductor laser device of Example 1.

Hereinafter, embodiments will be described in detail with reference to the appended drawings. In this specification and the appended drawings, structural elements that have substantially the same function and structure are denoted with the same reference numerals, and repeated explanation of these structural elements is omitted.

The present embodiments will be described in the order shown below:
1. General Description Including Mode-Locked Semiconductor Laser Device and Driving Method Thereof
2. First Embodiment (Mode-Locked Semiconductor Laser Device and Driving Method Thereof)
3. Second Embodiment (Modification of First Embodiment)
4. Third Embodiment (Another Modification of First Embodiment)
5. Fourth Embodiment (Another Modification of First Embodiment)

6. Fifth Embodiment (Another Modification of First Embodiment)

7. Sixth Embodiment (Another Modification of First Embodiment) and Others [First Embodiment (Mode-Locked Semiconductor Laser Device and Driving Method Thereof)]

A mode-locked semiconductor laser device in the present embodiment may adopt a mode in which a third compound semiconductor layer further comprises a saturable absorption region, a second electrode is separated into a first portion to create a forward bias state by passing a current to a first electrode via an emission region and a second portion to apply an electric field to the saturable absorption region by a separation groove, and the forward bias state is created by passing the current from the first portion of the second electrode to the first electrode via the emission region and the electric field is applied to the saturable absorption region by applying a voltage to between the first electrode and the second portion of the second electrode.

It is desirable to adopt a configuration in which a reverse bias voltage is applied to between the first electrode and the second portion (that is, a configuration in which the first electrode set as a positive electrode and the second portion as a negative electrode). A pulse current or a pulse voltage synchronized with the pulse current or the pulse voltage applied to the first portion of the second electrode may be applied to the second portion of the second electrode or a DC bias may be applied thereto.

In a mode-locked semiconductor laser device or the like in the embodiment including the above preferred mode or configuration, it is desirable that the value of electric resistance between the first portion and the second portion of the second electrode be $1\times10^2\Omega$ or more, preferably $1\times10^3\Omega$ or more, particularly preferably $1\times10^4\Omega$ or more. Alternatively, it is desirable that the value of electric resistance between the first portion and the second portion of the second electrode be $1\times10$ times the value of electric resistance between the second electrode and the first electrode or more, preferably $1\times10^2$ times or more, particularly preferably $1\times10^3$ times or more.

Here, by adopting the mode in which the value of electric resistance between the first portion and the second portion of the second electrode is $1\times10^2\Omega$ or more or 10 times the value of electric resistance between the second electrode and the first electrode or more, the flow of leakage current from the first portion of the second electrode to the second portion may surely be suppressed. That is, the current injected into emission regions (carrier injection regions, gain regions) may be increased and at the same time, a reverse bias voltage $V_{sa}$ applied to saturable absorption regions (carrier non-injection regions) may be raised. As a result, a single-mode self-pulsation operation having optical pulses with strong peak power may be realized. Moreover, such a large value of electric resistance between the first portion and the second portion of the second electrode may be achieved only by separating the second electrode into the first portion and the second portion by a separation groove. That is, optical pulse generation by mode locking may be realized still more easily.

Further, in a mode-locked semiconductor laser device or the like in the present embodiment including the above-described preferred mode or configuration, it is desirable that the width of the separation groove that separates the second electrode into the first portion and the second portion be 1 μm or more and 50% of the resonator length or less, preferably 10 μm or more and 10% of the resonator length or less. 0.3 mm may be exemplified as the resonator length, but the length thereof is not limited to this. In the description that follows, the direction of a resonator is defined as the x direction and the direction of thickness of a laminated structure as the Z direction. Alternatively, a configuration may be adopted in which the length of saturable absorption regions is shorter than that of emission regions. Alternatively, a configuration may be adopted in which the length of the second electrode (total length of the first portion and the second portion) is shorter than the length of the third compound semiconductor layer. Arrangement states of the first portion and the second portion of the second electrode include (1) a state in which two first portions of the second electrode and one second portion of the second electrode are provided, one edge of the second portion is opposite to one first portion sandwiching one separation groove therebetween, and the other edge of the second portion is opposite to the other first portion sandwiching the other separation groove therebetween (that is, the second electrode has a structure in which the second portion is sandwiched between the first portions), (2) a state in which one first portion of the second electrode and one second portion of the second electrode are provided and the first portion of the second electrode and the second portion of the second electrode are arranged sandwiching the separation groove therebetween, and (3) a state in which one first portion of the second electrode and two second portions of the second electrode are provided, one edge of the first portion is opposite to one second portion sandwiching one separation groove therebetween, and the other edge of the first portion is opposite to the other second portion sandwiching the other separation groove therebetween, and among others, it is desirable to adopt the structure of (1). More broadly, arrangement states of the first portions and the second portions of the second electrode include (4) a state in which N first portions of the second electrode and (N−1) second portions of the second electrode are provided and the first portions of the second electrode are arranged sandwiching the second portions of the second electrode therebetween and (5) a state in which N second portions of the second electrode and (N−1) first portions of the second electrode are provided and the second portions of the second electrode are arranged sandwiching the first portions of the second electrode therebetween. The states (4) and (5) are namely (4') a state in which N emission regions [carrier injection regions, gain regions] and (N−1) saturable absorption regions [carrier non-injection regions] are provided and the emission regions are arranged sandwiching the saturable absorption regions therebetween and (5') a state in which N saturable absorption regions [carrier non-injection regions] and (N−1) emission regions [carrier injection regions, gain regions] are provided and the saturable absorption regions are arranged sandwiching the emission regions therebetween. By adopting the structure of (1), (5), or (5'), the light emission end face of a mode-locked semiconductor laser device may be made resistant to damage.

Further, in a driving method for a mode-locked semiconductor laser device in the present embodiment including the above-described preferred mode or configuration, a mode in which a current is passed from the second electrode to the first electrode via emission regions and an external electric signal is superimposed on the first electrode from the second electrode via emission regions may be adopted. Accordingly, an optical pulse and the external electric signal may be synchronized. Alternatively, a mode in which an optical signal is caused to enter a laminated structure from one end face may be adopted. Accordingly, an optical pulse and the optical signal may be synchronized Further, in a mode-locked semiconductor laser device or the like in the present embodiment including the above-described preferred mode or configuration, a configuration in which an impurity with which the barrier layer is doped is silicon (Si) may be adopted, but the impurity is not limited to this and may be oxygen (O).

Further, a mode-locked semiconductor laser device or the like in the present embodiment including the above-described preferred mode or configuration may be a semiconductor laser device having a ridge stripe type separate confinement heterostructure (SCH structure). Alternatively, a mode-locked semiconductor laser device or the like in the present embodiment including the above-described preferred mode or configuration may be a semiconductor laser device having an oblique ridge stripe type separate confinement heterostructure. It is desirable that the height of a ridge structure be 0.1 μm or more and 10 μm or less, preferably 0.2 μm or more and 1 μm or less, but the height is not limited to such examples. 2 μm or less may be exemplified as the width of a ridge structure and, for example, 0.8 μm may be cited as the width of a ridge structure, but the width is not limited to this. A distance (D) from a top face portion of the second compound semiconductor layer positioned outside from both side faces of the ridge portion to the third compound semiconductor layer is preferably $1.0 \times 10^{-7}$ m (0.1 μm) or more. By defining the distance (D) in this way, saturable absorption regions may reliably be formed on both sides (Y direction) of the third compound semiconductor layer. The upper limit of the distance (D) may be decided based on the rise in threshold current, temperature characteristics, degradation of the rate of rise in current when driven for a long time and the like.

A mode-locked semiconductor laser device or the like in the present embodiment including the above-described preferred mode or configuration may be manufactured by, for example, the following method. That is, such a mode-locked semiconductor laser device may be manufactured by a manufacturing method including each process of:

(A) After forming a laminated structure formed by successively stacking a first compound semiconductor layer having a first conductive type and composed of a GaN base compound, a third compound semiconductor layer constituting emission regions and saturable absorption regions composed of a GaN base compound, and a second compound semiconductor layer having a second conductive type that is different from the first conductive and composed of a GaN base compound on a substrate, (B) a second electrode in a belt shape is formed on the second compound semiconductor layer and then, (C) after forming a ridge structure by etching at least a portion of the second compound semiconductor layer using the second electrode as an etching mask, (D) a resist layer to form a separation groove in the second electrode is formed and then, the separation groove is formed in the second electrode by wet etching using the resist layer as a wet etching mask to separate the second electrode into a first portion and a second portion by the separation groove.

By adopting such a manufacturing method, namely a ridge structure is formed by etching at least a portion of the second compound semiconductor layer using the second electrode in a belt shape as an etching mask, that is, a ridge structure is formed by self alignment using the patterned second electrode as an etching mask and therefore, the second electrode and the ridge structure will not be misaligned. The separation groove is formed in the second electrode by wet etching. By adopting, in contrast to dry etching, wet etching in this manner, degradation in optical and electric characteristics may be suppressed. Therefore, emission characteristics may reliably be prevented from being degraded.

In Process (C), the second compound semiconductor layer may be etched partially in the thickness direction, the second compound semiconductor layer may be etched entirely in the thickness direction, the second compound semiconductor layer and the third compound semiconductor layer may be etched in the thickness direction, or the second compound semiconductor layer and the third compound semiconductor layer and further the first compound semiconductor layer may partially be etched in the thickness direction.

Further in Process (D), if the etching rate of the second electrode is $ER_0$ when a separation groove is formed in the second electrode and the etching rate of the laminated structure is $ER_1$, it is desirable to satisfy $ER_0/ER_1 \geq 1 \times 10$, preferably $ER_0/ER_1 \geq 1 \times 10^2$. With such a relation being satisfied by $ER_0/ER_1$, the second electrode may reliably be etched without the laminated structure being etched (or only slightly if etched).

In a mode-locked semiconductor laser device or the like in the present embodiment, a mode in which the second electrode is composed of a palladium (Pd) single layer, a nickel (Ni) single layer, a platinum (Pt) single layer, a laminated structure of a palladium layer/platinum layer in which the palladium layer is in contact with the second compound semiconductor layer, or a laminated structure of a palladium layer/nickel layer in which the palladium layer is in contact with the second compound semiconductor layer may be adopted. If a lower metallic layer is constituted of palladium and an upper metallic layer is constituted of nickel, it is desirable that the thickness of the upper metallic layer be 0.1 μm or more, preferably 0.2 μm or more. Alternatively, it is preferable to configure the second electrode by the palladium (Pd) single layer and in this case, it is desirable that the thickness thereof be 20 nm or more, preferably 50 nm or more. Alternatively, it is preferable to configure the second electrode by the palladium (Pd) single layer, the nickel (Ni) single layer, the platinum (Pt) single layer, or a laminated structure of a lower metallic layer and an upper metallic layer in which the lower metallic layer is in contact with the second compound semiconductor layer (the lower metallic layer is constituted of one metal selected from a group of palladium, nickel, and platinum and the upper metallic layer is constituted of a metal whose etching rate when a separation groove is formed in the second electrode in Process (D) is equal to, equivalent to, or higher than the etching rate of the lower metallic layer). It is also desirable that the etchant used for forming a separation groove in the second electrode in Process (D) be aqua regia, nitric acid, sulfuric acid, hydrochloric acid, or a mixed solution of at least two of these acids (more specifically, a mixed solution of nitric acid and sulfuric acid or a mixed solution of sulfuric acid and hydrochloric acid). It is desirable that the width of the second electrode be 0.5 μm or more and 50 μm or less, preferably 1 μm or more and 5 μm or less.

In a mode-locked semiconductor laser device or the like in the present embodiment including the above-described preferred configuration or mode, the laminated structure may more specifically be constituted of an AlGaInN base compound semiconductor. More specifically, GaN, AlGaN, $Ga_{1-n}$N, and AlGaInN may be cited as the AlGaInN base compound semiconductor. Further, these compound semiconductors may contain boron (B) atoms, thallium (Tl) atoms, arsenic (As) atoms, phosphorus (P) atoms, or antimony (Sb) atoms if desired. The third compound semiconductor layer (the third compound semiconductor layer may be called an "active layer") constituting emission regions (gain regions) and saturable absorption regions has a quantum well structure. More specifically, the third compound semiconductor layer may have a single quantum well structure [QW structure] or a multi-quantum well structure [MQW structure]. The third compound semiconductor layer having a quantum well structure has a structure in which at least one well layer and one barrier layer are laminated and as a combination of (compound semiconductor constituting the well layer, compound semiconductor constituting the barrier layer), $(In_yGa_{(1-y)}N, GaN)$, $(In_yGa_{(1-y)}N, In_zGa_{(1-z)}N)$ [where y>z], and $(In_y Ga_{(1-y)}N, AlGaN)$ may be exemplified.

Further, in a mode-locked semiconductor laser device or the like in the present embodiment including the above-described preferred configuration or mode, the second compound semiconductor layer may have a structure having a superlattice structure in which a p-type GaN layer and a p-type AlGaN layer are alternately laminated and whose thickness is 0.7 μm or less. By adopting such a superlattice structure, a series resistance component of the semiconductor laser device may be lowered while maintaining a high refractive index necessary as a clad layer, leading to a lower voltage operation of the semiconductor laser device. For example, 0.3 μm may be cited as the lower limit of the thickness of the superlattice structure, though not limited to this, 1 nm to 5 nm may be exemplified as the thickness of the p-type GaN layer constituting the superlattice structure, 1 nm to 5 nm may be exemplified as the thickness of the p-type AlGaN layer constituting the superlattice structure, and 60 layers to 300 layers may be exemplified as the total layers of the p-type GaN layer and the p-type AlGaN layer. The distance from the third compound semiconductor layer to the second electrode may be configured to be 1 μm or less, preferably 0.6 μm or less. By defining the distance from the third compound semiconductor layer to the second electrode in this way, the p-type second compound semiconductor layer with high resistance may be made thinner to achieve a lower operating voltage of the semiconductor laser device. For example, 0.3 μm may be cited as the lower limit of the distance from the third compound semiconductor layer to the second electrode, though not limited to this. The second compound semiconductor layer may be configured to be doped with $1\times10^{19}$ cm$^{-3}$ of Mg or more so that the absorption coefficient of light whose wavelength is 405 nm from the third compound semiconductor layer by the second compound semiconductor layer is at least 50 cm$^{-1}$. This atom density of Mg is derived from material properties that the maximum hole density is indicated when the value of density is $2\times10^{19}$ cm$^{-3}$ and is a result of design to achieve the maximum hole density, that is, the specific resistance of the second compound semiconductor layer is minimized. The absorption coefficient of the second compound semiconductor layer is defined from the standpoint of lowering the resistance of the semiconductor laser device as much as possible and, as a result, the absorption coefficient of the third compound semiconductor layer generally becomes 50 cm$^{-1}$. However, the amount of doped Mg may be intentionally set to $2\times10^{19}$ cm$^{-3}$ or more to increase the absorption coefficient. In such a case, the upper limit of the amount of doped Mg to obtain a practical hole density is, for example, $8\times10^{19}$ cm$^{-3}$. The second compound semiconductor layer has a non-doped compound semiconductor layer and a p-type compound semiconductor layer from the side of the third compound semiconductor layer and the distance from the third compound semiconductor layer to the p-type compound semiconductor layer may be configured to be $1.2\times 10^{-7}$ m or less. By defining the distance from the third compound semiconductor layer to the p-type compound semiconductor layer in this way, internal losses may be suppressed within a range in which internal quantum efficiency does not fall. Accordingly, a threshold current $I_{th}$ at which laser oscillation is started may be reduced. For example, $5\times10^{-8}$ m may be cited as the lower limit of the distance from the third compound semiconductor layer to the p-type compound semiconductor layer, though not limited to this. A laminated dielectric film composed of an SiO$_2$/Si laminated structure is formed on both side faces of the ridge portion and a difference between the effective refractive index of the ridge portion and that of the laminated dielectric film may be configured to be $5\times10^{-3}$ to $1\times10^{-2}$. By using such a laminated dielectric film, a single fundamental transverse mode may be maintained even for a high output operation exceeding 100 mW. The second compound semiconductor layer may have a structure in which, for example, a non-doped Ga$_{1-n}$N layer (p-side optical guide layer), a non-doped AlGaN layer (p-side clad layer), an Mg doped AlGaN layer (electron barrier layer), a superlattice structure of GaN layer (Mg doped)/AlGaN layer (superlattice clad layer), and an Mg doped GaN layer (p-side contact layer) are laminated from the side of the third compound semiconductor layer. It is desirable that the band gap of a compound semiconductor constituting a well layer in the third compound semiconductor layer be 2.4 eV or more. It is also desirable that the wavelength of laser light emitted from the third compound semiconductor layer be 360 nm to 500 nm, preferably 400 nm to 410 nm. It is needless to say that various configurations described above may suitably be combined.

In the second compound semiconductor layer, as described above, a non-doped compound semiconductor layer (for example, a non-doped Ga$_{1-n}$N layer or non-doped AlGaN layer) may be formed between the third compound semiconductor layer and the electron barrier layer. Further, a non-doped Ga$_{1-n}$N layer as an optical guide layer may be formed between the third compound semiconductor layer and the non-doped compound semiconductor layer. The second compound semiconductor layer may also a structure in which the top layer thereof is occupied by an Mg doped GaN layer (p-side contact layer).

Various GaN base compound semiconductor layers constituting a mode-locked semiconductor laser device or the like in the present invention are successively formed on a substrate and in addition to the sapphire substrate, a GaAs substrate, a GaN substrate, an SiC substrate, an alumina substrate, a ZnS substrate, a ZnO substrate, an AlN substrate, an LiMgO substrate, an LiGaO$_2$ substrate, an MgAl$_2$O$_4$ substrate, an InP substrate, an Si substrate, and a substrate obtained by forming a foundation layer or buffer layer on the surface (principal plane) of one of these substrates may be cited as the substrate. When mainly GaN base compound semiconductor layers are formed on a substrate, the GaN substrate is preferred due to a low defect density, but the GaN substrate is known to change characteristics of polarity/non-polarity/semi-polarity depending on a grown surface. Formation methods of various GaN base compound semiconductor layers constituting a mode-locked semiconductor laser device or the like in the present invention include the metal organic chemical vapor deposition (MOCVD, MOVPE), the molecular beam epitaxy (MBE), and the hydride vapor deposition in which halogen contributes to transport or reactions.

A trimethylgallium (TMG) gas and a triethylgallium (TEG) gas may be cited as an organic gallium source gas for the MOCVD, and an ammonium gas and a hydrazine gas may be cited as nitrogen source gas. For example, silicon (Si) may be added as an n-type impurity (n-type dopant) for the formation of a GaN base compound semiconductor layer having an n-type conductive type and, for example, magnesium (Mg) may be added as a p-type impurity (p-type dopant) for the formation of a GaN base compound semiconductor layer having a p-type conductive type. If aluminum (Al) or indium (In) is contained as constituent atoms of a GaN base compound semiconductor layer, a trimethylaluminum (TMA) gas may be used as an Al source and a trimethylindium (TMI) gas as an In source. Further, a mono-silane gas ($SiH_4$ gas) may be used as an Si source and a cyclopentadienyl magnesium gas, methylcyclopentadienyl magnesium, or biscyclopentadienyl magnesium ($Cp_2Mg$) may be used as an Mg source. In addition to Si as an n-type impurity, Ge, Se, Sn, C, Te, S, O, Pd, and Po may be cited and, in addition to Mg as a p-type impurity, Zn, Cd, Be, Ca, Ba, C, Hg, and Sr may be cited.

If the first conductive type is of n type, it is desirable that the first electrode electrically connected to the first compound semiconductor layer having the n-type conductive type have a single-layer configuration or multi-layer configuration containing at least one metal selected from a group consisting of gold (Au), silver (Ag), palladium (Pd), aluminum (Al), titanium (Ti), tungsten (w), copper (Cu), zinc (Zn), tin (Sn), and indium (In) and, for example, Ti/Au, Ti/Al, and Ti/Pt/Au may be exemplified. The first electrode is electrically connected to the first compound semiconductor layer and this includes a mode in which the first electrode is formed on the first compound semiconductor layer and a mode in which the first electrode is connected to the first compound semiconductor layer via a conductive material layer or a conductive substrate. The first electrode and the second electrode may be formed by, for example, the vacuum evaporation method or PVD such as the sputtering method.

A pad electrode to electrically connect to an external electrode or circuit may be provided on the first electrode or the second electrode. It is desirable that the pad electrode have a single-layer configuration or multi-layer configuration containing at least one metal selected from a group consisting of titanium (Ti), aluminum (Al), platinum (Pt), gold (Au), and nickel (Ni). Alternatively, the pad electrode may have a multiplayer configuration exemplified by a Ti/Pt/Au multiplayer configuration or a Ti/Au multiplayer configuration.

A mode-locked semiconductor laser device or the like in the present embodiment may further adopt a mode in which an external reflector is provided. That is, the mode-locked semiconductor laser device may be made a mode-locked semiconductor laser device of external resonator type. Alternatively, the mode-locked semiconductor laser device may be made a monolithic type mode-locked semiconductor laser device. The mode-locked semiconductor laser device of external resonator type may be of condensing type or of collimator type. In a mode-locked semiconductor laser device of external resonator type, the optical reflectance on one end face of a laminated structure from which an optical pulse is emitted is preferably 0.5% or less. This value of optical reflectance is a value significantly smaller than the optical reflectance (generally, 5% to 10%) on one end face of a laminated structure from which an optical pulse is emitted in a semiconductor laser device in the related art. In a mode-locked semiconductor laser device of external resonator type, it is desirable that the value of length (X', unit: mm) of the external resonator be $0<X'<1500$, preferably $30 \leq X' \leq 150$.

A mode-locked semiconductor laser device in the present invention or a driving method thereof may be applied to fields such as an optical disk system, communication field, optical information field, optoelectronic integrated circuit field, field in which nonlinear optical phenomena are applied, optical switch, laser measurement field and various analysis fields, ultrahigh spectroscopic field, multi-photon excitation spectroscopic field, mass spectrometry field, microspectroscopy field using multi-photon absorption, quantum control of chemical reactions, nano three-dimensional processing field, various processing fields using multi-photon absorption, medical field, and bio-imaging field.

Example 1

Example 1 relates to a mode-locked semiconductor laser device in the present embodiment and a driving method thereof. FIG. 1 shows a schematic end face view (schematic end face view when cut by the XZ plane) along a direction in which a resonator of a mode-locked semiconductor laser device of Example 1 extends and FIG. 2 shows a schematic sectional view (schematic sectional view when cut by the YZ plane) along the direction perpendicular to the direction in which the resonator of the mode-locked semiconductor laser device of Example 1 extends. FIG. 1 is a schematic end face view along an arrow I-I in FIG. 2 and FIG. 2 is a schematic sectional view along an arrow II-II in FIG. 1. FIG. 3 schematically shows a system that carries out mode-locked driving by constituting an external resonator from the mode-locked semiconductor laser device of Example 1.

A mode-locked semiconductor laser device 10 of Example 1 whose luminous wavelength is in the 405 nm band includes;

(a) a laminated structure in which a first compound semiconductor layer 30 having a first conductive type (more specifically, the n-type conductive type of Example 1) and composed of a GaN base compound semiconductor, a third compound semiconductor layer (active layer) 40 having an emission region (gain region) 41 composed of a GaN base compound semiconductor, and a second compound semiconductor layer 50 having a second conductive type (more specifically, the p-type conductive type of Example 1) that is different from the first conductive type and composed of a GaN base compound semiconductor are successively laminated, (b) a second electrode 62 in a belt shape formed on the second compound semiconductor layer 50, and (c) a first electrode 61 electrically connected to the first compound semiconductor layer 30.

The third compound semiconductor layer 40 further includes a saturable absorption region 42. The second electrode 62 is separated into a first portion 62A that creates a forward bias state by passing a current to the first electrode 61 via the emission region 41, a second portion 62B to apply an electric field to the saturable absorption region 42, by a separation groove 62C. Then, a forward bias state is created by passing a current from the first portion 62A of the second electrode 62 to the first electrode 61 via the emission region 41 and an electric field is applied to the saturable absorption region 42 by applying a voltage to between the first electrode 61 and the second portion 62B of the second electrode 62.

The laminated structure is formed on a compound semiconductor substrate 21 having polarity. The third compound semiconductor layer 40 has a quantum well structure including a well layer and a barrier layer, the thickness of the well layer is 1 nm or more and 10 nm or less, and the doping density of an impurity (more specifically, silicon Si) in the barrier layer is $2\times10^{18}$ $cm^{-3}$ or more and $1\times10^{20}$ $cm^{-3}$ or less. According to the driving method of the mode-locked semiconductor laser device of Example 1, an optical pulse is generated in the emission region 41 by passing a current from the second electrode 62 to the first electrode 61 via the laminated structure. In the mode-locked semiconductor laser device of Example 1, an optical pulse develops in the emission region 41 by a current being passed from the second electrode 62 to the first electrode 61 via the laminated structure.

The mode-locked semiconductor laser device 10 of Example 1 is concretely a semiconductor laser device having a ridge stripe type separate confinement heterostructure (SCH structure). More specifically, the mode-locked semiconductor laser device 10 is a GaN base semiconductor laser device composed of index guide type AlGaInN developed for a Blu-ray optical disk system and has a linear ridge structure (ridge stripe structure). The mode-locked semiconductor laser device 10 is provided on a (0001) plane of the n-type GaN substrate 21 and the third compound semiconductor layer 40 has a quantum well structure. The (0001) plane of the n-type GaN substrate 21 is also called a "C plane" and is a crystal plane having polarity. The first compound semiconductor layer 30, the third compound semiconductor layer 40, and the second compound semiconductor layer 50 are concretely composed of an AlGaInN base compound semiconductor and more specifically, have a layer structure shown in Table 1 below.

In Table 1, the lower a compound semiconductor layer is described, the closer the layer is to the n-type GaN substrate 21. The band gap of a compound semiconductor constituting a well layer in the third compound semiconductor layer 40 is 3.06 eV.

TABLE 1

Second compound semiconductor layer 50
   p-type GaN contact layer (Mg doped) 55
   p-type GaN (Mg doped)/AlGaN superlattice clad layer 54
   p-type AlGaN electron barrier layer (Mg doped) 53
   non-doped AlGaN clad layer 52
   non-doped GaInN optical guide layer 51
Third compound semiconductor layer 40
   GaInN quantum well active layer
      (well layer: $Ga_{0.92}In_{0.08}N$/barrier layer: $Ga_{0.98}In_{0.02}N$)
First compound semiconductor layer 30
   n-type FaN clad layer 32
   n-type AlGaN clad layer 31
where,
Well layer (two layers): 8 nm [non-doped]
Barrier layer (three layers): 10 nm [doping density (Si): $2 \times 10^{18}$ $cm^{-3}$]

A portion of the p-type GaN contact layer 55 and the p-type GaN/AlGaN superlattice clad layer 54 is removed by the RIE method to form a ridge structure (ridge portion 56). A laminated dielectric film 57 composed of $SiO_2$/Si is formed on both sides of the ridge portion 56. The $SiO_2$ layer is the lower layer and the Si layer is the upper layer. A difference between the effective refractive index of the ridge portion 56 and that of the laminated dielectric film 57 is $5 \times 10^{-3}$ to $1 \times 10^{-2}$ and concretely $7 \times 10^{-3}$. The second electrode (p-side ohmic electrode) 62 is formed on the p-type GaN contact layer 55 corresponding to the top face of the ridge portion 56. On the other hand, the first electrode (n-side ohmic electrode) 61 composed of Ti/Pt/Au is formed on the rear side of the n-type GaN substrate 21. More specifically, the laminated dielectric film 57 is formed as an $SiO_2$/Si laminated structure and the width of the ridge structure is set to 1.5 μm.

In the mode-locked semiconductor laser device 10 of Example 1, internal losses are suppressed within a range in which the internal quantum efficiency does not fall by preventing the p-type AlGaN electron barrier layer 53, the p-type GaN/AlGaN superlattice clad layer 54, and the p-type GaN contact layer 55, which are Mg doped compound semiconductor layers, from overlapping with the distribution of light density generated in the third compound semiconductor layer 40 and the vicinity thereof as much as possible. Accordingly, a threshold current $I_{th}$ at which laser oscillation starts is reduced. Further, while an internal loss $\alpha_i$ is reduced by making the value of a distance d from the third compound semiconductor layer 40 to the p-type AlGaN electron barrier layer 53 larger, it has been revealed that if the value of d reaches a certain value or beyond, the injection efficiency of holes into the well layer falls and, as a result, the probability of recombination of electrons/holes in the third compound semiconductor layer 40 falls, which reduces an internal quantum efficiency $\eta_i$. Therefore, the distance d from the third compound semiconductor layer 40 to the p-type AlGaN electron barrier layer 53 is set to 0.10 μm, the height of the ridge portion (ridge structure) to 0.30 μm, the thickness of the second compound semiconductor layer 50 positioned between the second electrode 62 and the third compound semiconductor layer 40 to 0.50 μm, and the thickness of a portion of the p-type GaN/AlGaN superlattice clad layer 54 positioned below the second electrode 62 to 0.40 μm. The "distance (d) between the electron barrier layer 53 and the third compound semiconductor layer 40" means a distance between a portion (boundary surface) of the electron barrier layer 53 facing the third compound semiconductor layer 40 and a portion (boundary surface) of the third compound semiconductor layer 40 facing the electron barrier layer 53.

In the mode-locked semiconductor laser device 10 of Example 1, the second electrode 62 is separated, as described above, into the first portion 62A that creates a forward bias state by passing a DC current (forward bias current $I_{gain}$) to the first electrode 61 via the emission region (gain region) 41, the second portion 62B to apply an electric field to the saturable absorption region 42 (the second portion 62B to apply a reverse bias voltage $V_{sa}$ to the saturable absorption region 42), by the separation groove 62C. The value of electric resistance (may also be called the "value of separated resistance") between the first portion 62A and the second portion 62B of the second electrode 62 is 1×10 times or more, concretely $1.5 \times 10^3$ times the value of electric resistance between the second electrode 62 and the first electrode 61. The value of electric resistance (value of separated resistance) between the first portion 62A and the second portion 62B of the second electrode 62 is $1 \times 10^2 \Omega$ or more, concretely $1.5 \times 10^4 \Omega$.

Incidentally, it is necessary to form the second electrode 62 having the value of separated resistance of $1 \times 10^2 \Omega$ or more on the second compound semiconductor layer 50. In a GaN base semiconductor laser device, in contrast to a GaAs base semiconductor laser device in the related art, the mobility in a compound semiconductor having the p-type conductive type is small and therefore, the value of electric resistance between the first portion 62A and the second portion 62B of the second electrode 62 may be made 1×10 times the value of electric resistance between the second electrode 62 and the first electrode 61 or more or the value of electric resistance between the first portion 62A and the second portion 62B of the second electrode 62 may be made $1 \times 10^2 \Omega$ or more by separating the second electrode 62, which is formed on the second compound semiconductor layer 50, by the separation groove 62C without the need to increase the resistance of the second compound semiconductor layer 50 having the p-type conductive type by ion implantation.

Of Example 1, the second electrode 62 is configured by a Pd single layer whose thickness is 0.1 μm. Also of Example 1, the width of the separation groove 62C that separates the second electrode 62 into the first portion 62A and the second portion 62B is 1 μm or more and 50% of the resonator length or less. Alternatively, the length of the saturable absorption region 42 is shorter than that of the emission region 41. Alternatively, the length of the second electrode 62 (total length of the first portion and the second portion) is shorter than that of the third compound semiconductor layer 40.

More specifically, the resonator length X" is set to 0.60 mm, the length of the first portion 62A of the second electrode 62 to 0.52 mm, the length of the second portion to 0.06 mm, and the width of the separation groove 62C to 0.02 mm.

The thickness of the p-type GaN/AlGaN superlattice clad layer 54 having a superlattice structure in which a p-type GaN layer and a p-type AlGaN layer are alternately laminated is set to 0.7 μm or less, concretely 0.4 μm, the thickness of the p-type GaN layer constituting the superlattice structure to 2.5 nm, the thickness of the p-type AlGaN layer constituting the superlattice structure to 2.5 nm, and the total number of layers of the p-type GaN layer and the p-type AlGaN layer to 160 layers. The distance from the third compound semiconductor layer 40 to the second electrode 62 is 1 μm or less, concretely 0.5 μm. Further, the p-type AlGaN electron barrier layer 53, the p-type GaN/AlGaN superlattice clad layer 54, and the p-type GaN contact layer 55 constituting the second compound semiconductor layer 50 are doped with Mg of $1 \times 10^{19}$ cm$^{-3}$ or more (concretely $2 \times 10^{19}$ cm$^{-3}$) and the absorption coefficient of light whose wavelength is 405 nm by the second compound semiconductor layer 50 is at least 50 cm$^{-1}$, concretely 65 cm$^{-1}$. The second compound semiconductor layer 50 includes non-doped compound semiconductor layers (the non-doped $Ga_{1-n}N$ optical guide layer 51 and the non-doped AlGaN clad layer 52) and p-type compound semiconductor layers from the side of the third compound semiconductor layer and the distance (d) from the third compound semiconductor layer 40 to a p-type compound semiconductor layer (concretely, the p-type AlGaN electron barrier layer 53) is $1.2 \times 10^{-7}$ m or less, concretely 100 nm.

Also, a mode-locked semiconductor laser device of Comparative Example 1 is produced and, in the mode-locked semiconductor laser device of Comparative Example 1, the configuration of the third compound semiconductor layer 40 in a layer system shown in Table 1 is as shown in Table 2 below:

TABLE 2

| | Example 1 | Comparative Example 1 |
|---|---|---|
| Well layer | 8 nm | 10.5 nm |
| Barrier layer | 12 nm | 14 nm |
| Impurity doping density in well layer | Not doped | Not doped |
| Impurity doping density in barrier layer | Si: $2 \times 10^{18}$ cm$^{-3}$ | Not doped |

In Example 1, the thickness of the well layer is 8 nm and the barrier layer is doped with Si of $2 \times 10^{18}$ cm$^{-3}$ so that the QCS effect inside the third compound semiconductor layer is mitigated. In Comparative Example 1, on the other hand, the thickness of the well layer is 10.5 nm and the barrier layer is not doped with any impurity.

Figure 9:
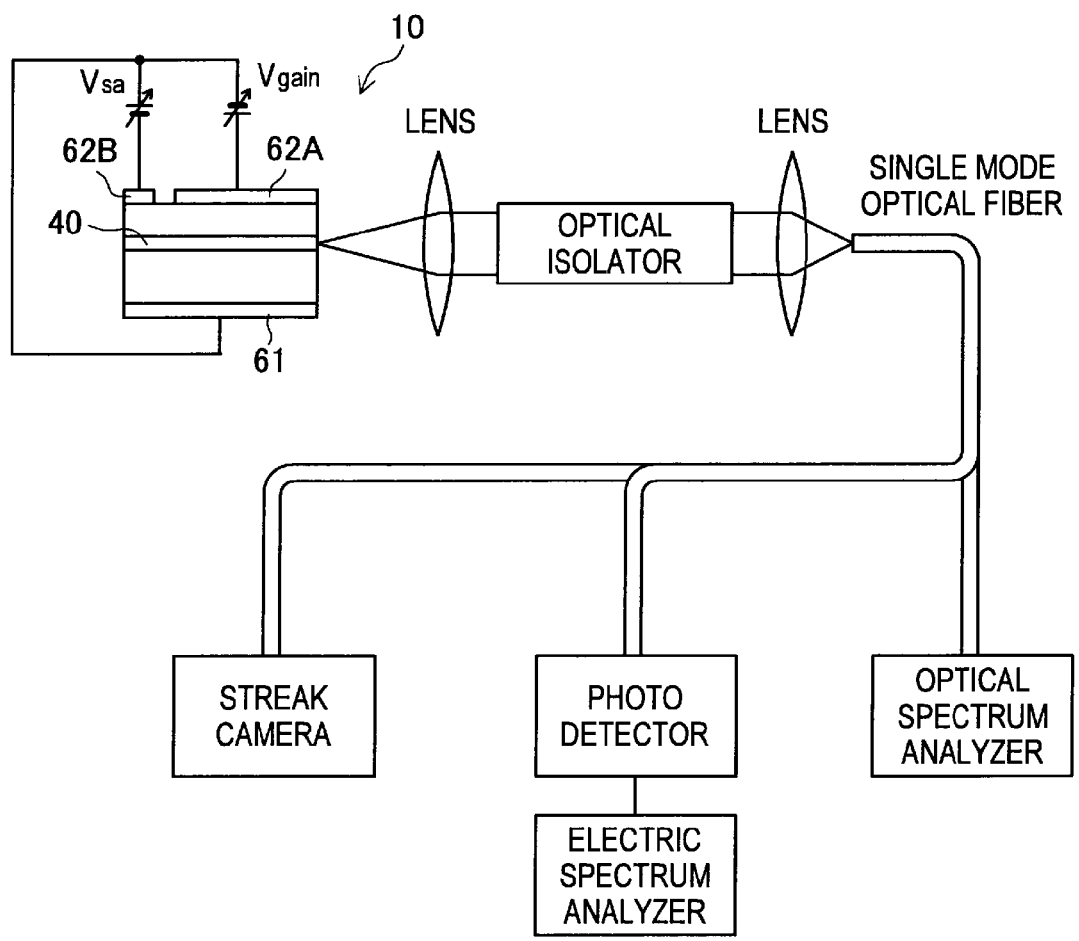
FIG. 9 is a diagram schematically showing a measuring system used for evaluation of a self-pulsation operation of the mode-locked semiconductor laser device of Example 1.

FIG. 9 shows a measuring system used for evaluation of a self-pulsation operation of the mode-locked semiconductor laser device 10 of Example 1. In the measurement, the constant DC voltage $V_{sa}$ is applied to the saturable absorption region 42 to pass a DC weak current (voltage $V_{gain}$) to the emission region (gain region) 41. That is, the negative constant DC voltage $V_{sa}$ is applied to the second portion 62B of the second electrode 62 to pass a DC weak current from the first portion 62A of the second electrode 62 to the first electrode 61. Then, a laser light emitted from the mode-locked semiconductor laser device 10 is collimated by a lens and passed through an optical isolator and then, combined with a single mode fiber by a lens to evaluate the light from the single mode fiber by using a photo-detector, electric spectrum analyzer, optical spectrum analyzer, and streak camera.

Figure 10A:
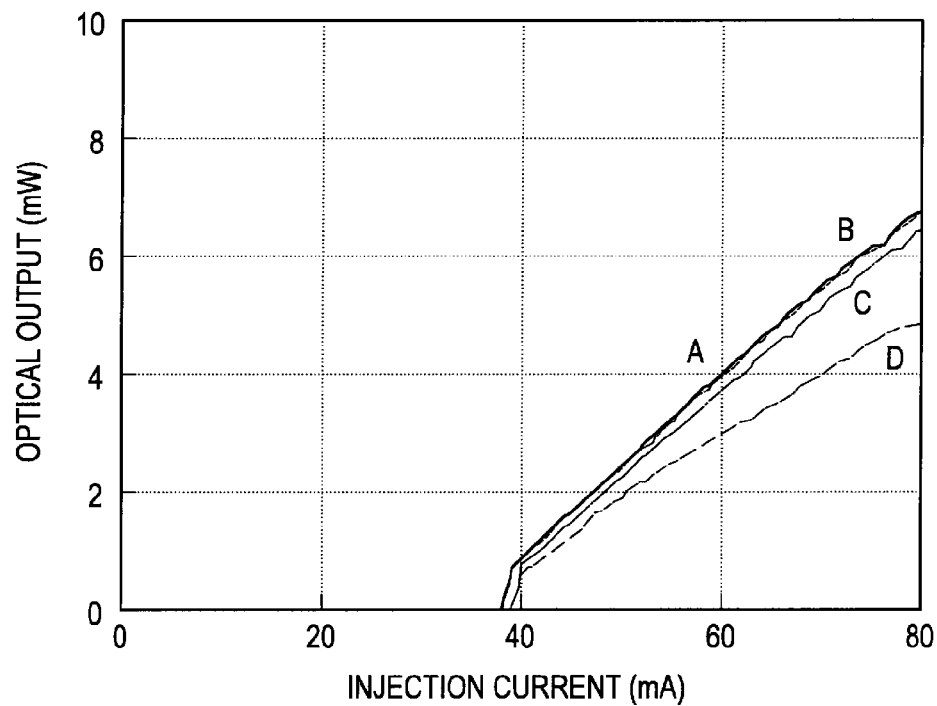
FIG. 10A is a graph showing a reverse bias voltage dependency measuring result of a relationship (L-I characteristics) between an injection current and optical output of Example 1.
Figure 10B:
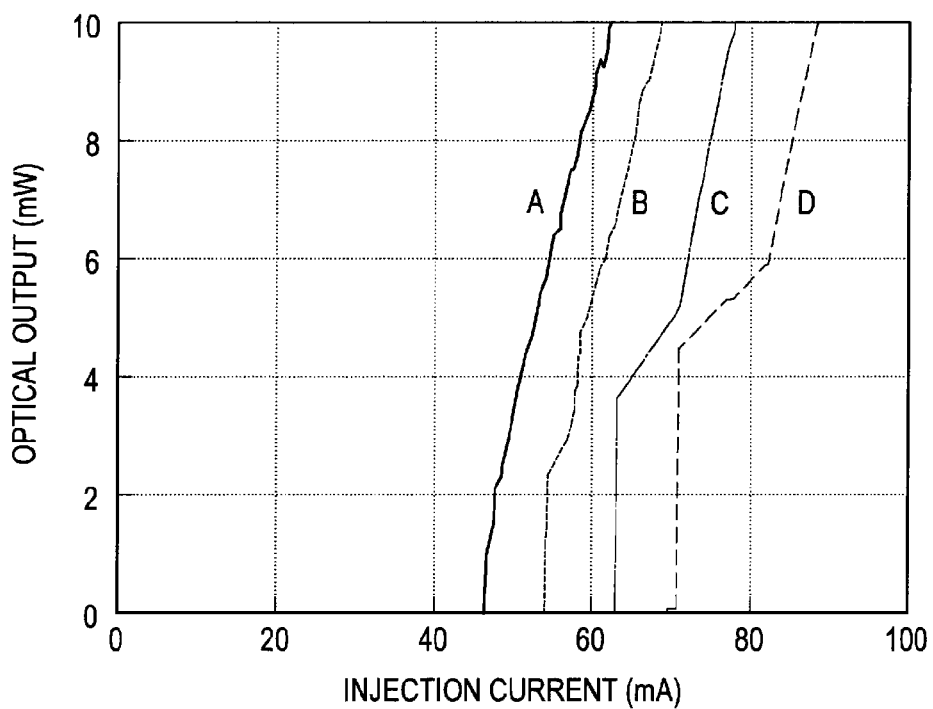
FIG. 10B is a graph showing a reverse bias voltage dependency measuring result of a relationship (L-I characteristics) between an injection current and optical output of Comparative Example 1.

Then, an external resonator of condensing type is configured from mode-locked semiconductor laser devices of Example 1 and Comparative Example 1 to carry out mode-locked driving (see FIG. 3A). In the external resonator of condensing type shown in FIG. 3A, an external resonator is configured by an end face of the mode-locked semiconductor laser device in which a high reflection coat layer (HR) is formed on the side of the saturable absorption region and an external mirror and an optical pulse is extracted from the external mirror. An antireflection coat layer (AR) is formed on an end face (light emitting end face) of the mode-locked semiconductor laser device on the side of the emission region (gain region). Mainly a band-pass filter is used as an optical filter, which is inserted to control the oscillation wavelength of laser. A repetition frequency f of a pulse train is decided by an external resonator length X' and is expressed by the following formula, where c is the speed light and n is the refractive index of a waveguide. $F = c/(2n \cdot X')$ Mode locking is decided by a DC current applied to the emission region 41 and the reverse bias voltage $V_{sa}$ applied to the saturable absorption region 42. FIGS. 10A and 10B show reverse bias voltage dependency measurement results of the relationship (L-I characteristics) between the injection current and optical output of Example 1 and Comparative Example 1. In FIGS. 10A and 10B, a measurement result to which "A" is attached is a result of the reverse bias voltage $V_{sa}$=0 V, a measurement result to which "B" is attached is a result of the reverse bias voltage $V_{sa}$=−3 V, a measurement result to which "C" is attached is a result of the reverse bias voltage $V_{sa}$=−6 V, and a measurement result to which "D" is attached is a result of the reverse bias voltage $V_{sa}$=−9 V. In FIG. 10A, the measurement result of the reverse bias voltage $V_{sa}$=0 V and that of the reverse bias voltage $V_{sa}$=−3 V nearly overlap.

Comparison of FIGS. 10A and 10B shows that the threshold current $I_{th}$ at which laser oscillation starts gradually rises with the increasing reverse bias voltage $V_{sa}$ in Comparative Example 1 and further, compared with Example 1, changes occur at the lower reverse bias voltage $V_{sa}$. This indicates that the effect of saturable absorption is electrically controlled by the reverse bias voltage $V_{sa}$ better in the third compound semiconductor layer 40 of Example 1.

Figure 11A:
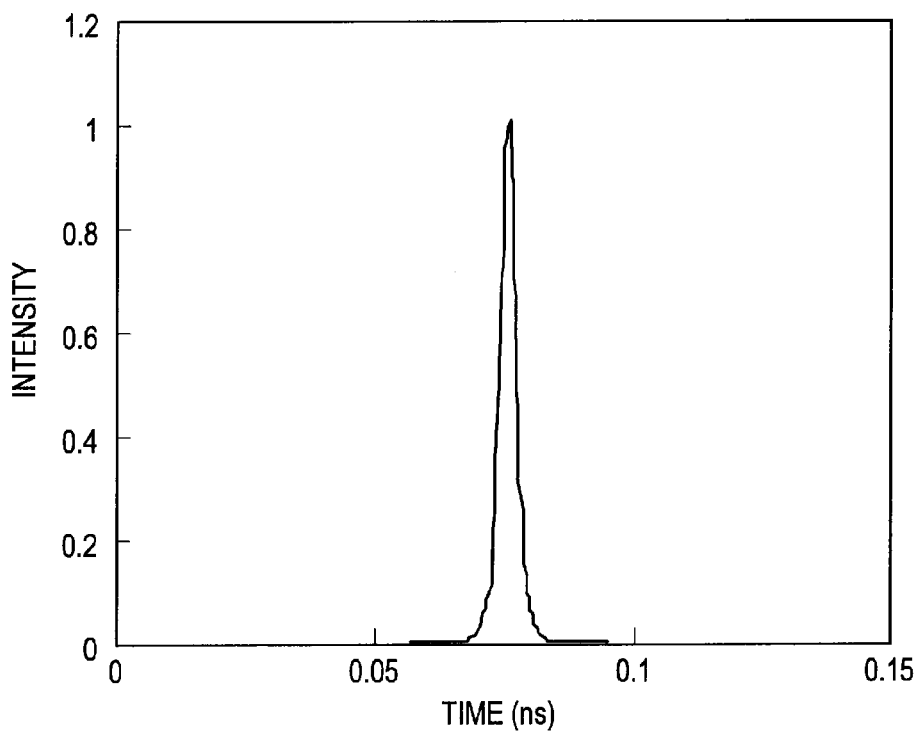
FIG. 11A is a graph showing a result of measuring optical pulses generated of Example 1 using a streak camera.
Figure 11B:
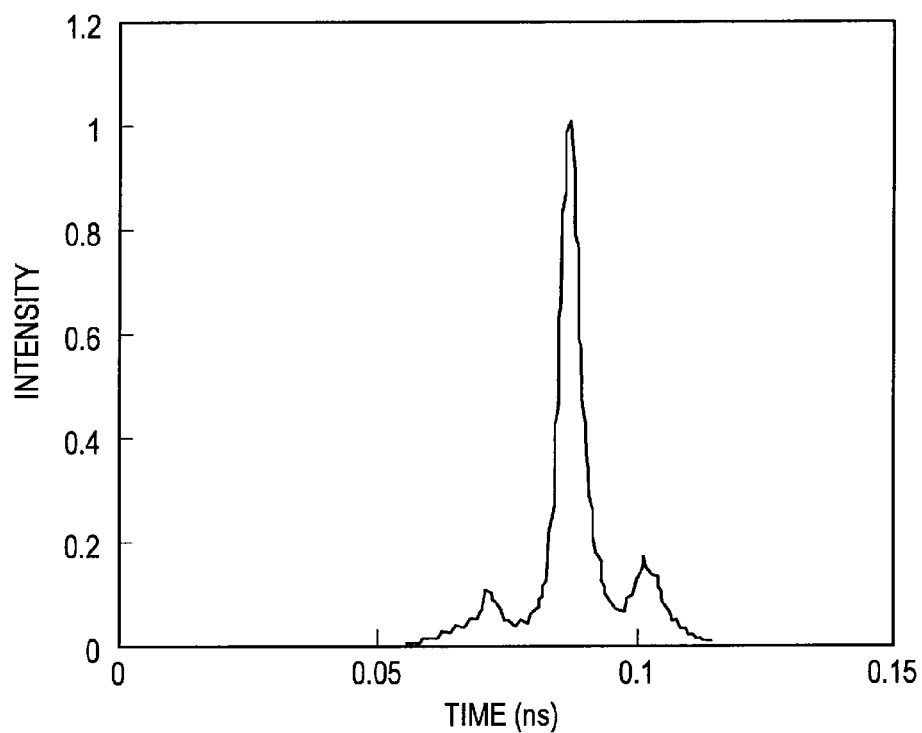
FIG. 11B is a graph showing a result of measuring optical pulses generated of Comparative Example 1 using a streak camera.

FIGS. 11A and 11B show results of measurement of optical pulses generated in Example 1 and Comparative Example 1 by a streak camera. While sub-pulse components are generated before and after a main pulse in FIG. 11B obtained from Comparative Example 1, generation of a sub-pulse component is suppressed in FIG. 11A obtained from Example 1. These results are all considered to result from the fact that the effect of saturable absorption is heightened by mitigation of the QCS effect caused by the configuration of the third compound semiconductor layer 40.

Driving conditions and the like of the mode-locked semiconductor laser device of Example 1 shown in FIG. 3A are exemplified in Table 3 below. $I_{th}$ is the threshold current.

TABLE 3

[Mode-locked driving conditions]
    $0 < I_{gain}/I_{th} \leq 5$
    $-20 \leq V_{sa}$ (volt) $\leq 0$
[High reflection coat layer (HR)]
    $85 \leq$ reflectance $R_{HR}$ (%) $< 100$
[Antireflection coat layer (AR)]
    $0 <$ reflectance $R_{AR}$ (%) $\leq 0.5$ TABLE 3-continued

[Optical filter]
    $85 \leq$ transmittance $T_{BPF}$ (%) < 100
    $0 <$ half-width $\tau_{BPF}$ (nm) $\leq 2.0$
    $400 <$ peak wavelength $\lambda_{BPF}$ (nm) $\leq 450$
[External mirror]
    $0 <$ reflectance $R_{OC}$ (%) < 100
[External resonator length X']
    $0 <$ X' (mm) < 15

More specifically, as an example, the following settings are made for Example 1

$I_{gain}$=120 mA
$I_{th}$=45 mA
Reverse bias voltage V=−11 (V)
Reflectance $R_{HR}$=95(%)
Reflectance $R_{AR}$=0.3(%)
Transmittance $T_{BPF}$=90(%)
Half-width $\tau_{BPF}$=1 nm
Peak wavelength $\lambda_{BPF}$=410 nm
Reflectance $R_{OC}$=20%
External resonator length X'=150 mm For Comparative Example 1, for example, the following settings are made:

$I_{gain}$=95 mA
$I_{th}$=50 mA
Reverse bias voltage V=−12.5 (V). Other data settings are the same as those in Example 1.

Figure 16:
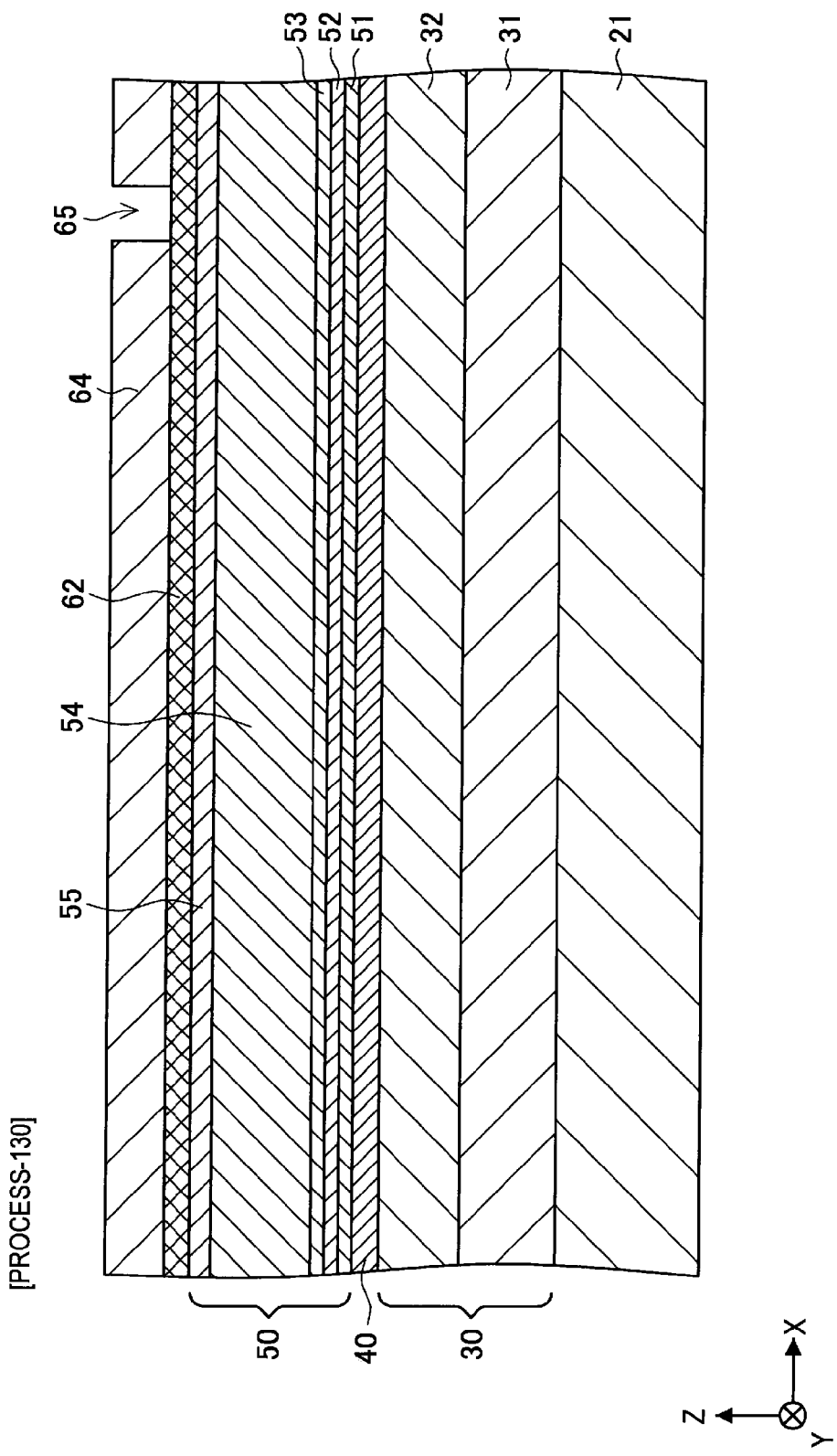
FIG. 16 is continued from FIG. 15B and is a schematic partial sectional view of the substrate and the like to illustrate the manufacturing method of the mode-locked semiconductor laser device of Example 1.

The manufacturing method of a mode-locked semiconductor laser device of Example 1 will be described with reference to FIGS. 14A, 14B, 15A, 15B, and 16. FIGS. 14A, 14B, 15A, and 15B are schematic partial sectional views when a substrate or the like is cut by a YZ plane. FIG. 16 is a schematic partial sectional view when a substrate or the like is cut by a XZ plane.

Characteristics demanded of the second electrode 62 are as follows: (1) Have a function as an etching mask when the second compound semiconductor layer 50 is etched. (2) The second electrode 62 is wet etchable without causing degradation in optical or electric characteristics of the second compound semiconductor layer 50. (3) When a film is formed on the second compound semiconductor layer 50, the value of contact resistivity of the film is $10^{-2} \Omega$ cm$^2$ or less. (4) If a laminated structure is adopted, a material constituting a lower metallic layer has a large work function, has a small value of contact resistivity with regard to the second compound semiconductor layer 50, and is wet etchable. (5) If a laminated structure is adopted, a material constituting an upper metallic layer is resistant to etching (for example, a Cl$_2$ gas used in the RIE method) when a ridge structure is formed and also wet etchable.

[Process—100]

Figure 14A:
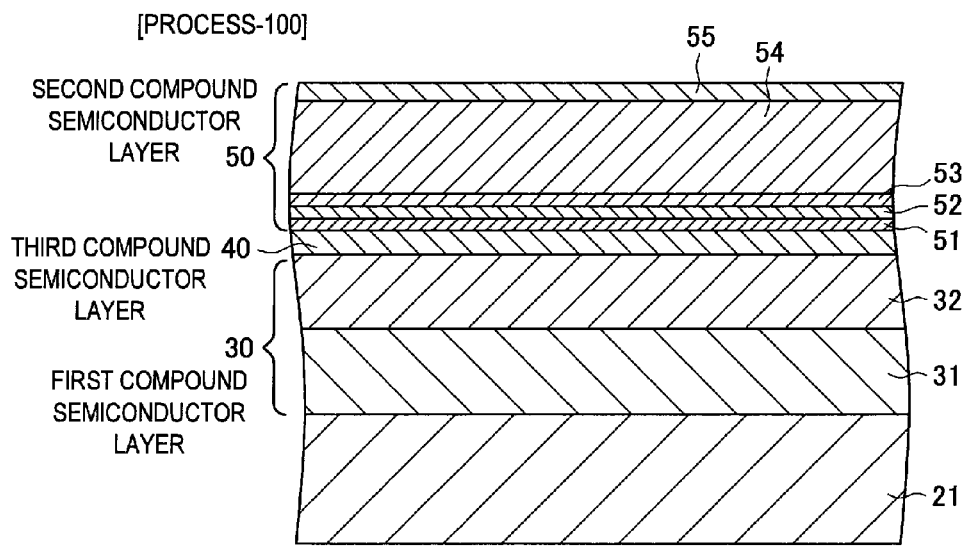
FIG. 14A is a schematic partial sectional view of a substrate or the like to illustrate a manufacturing method of the mode-locked semiconductor laser device of Example 1.
Figure 14B:
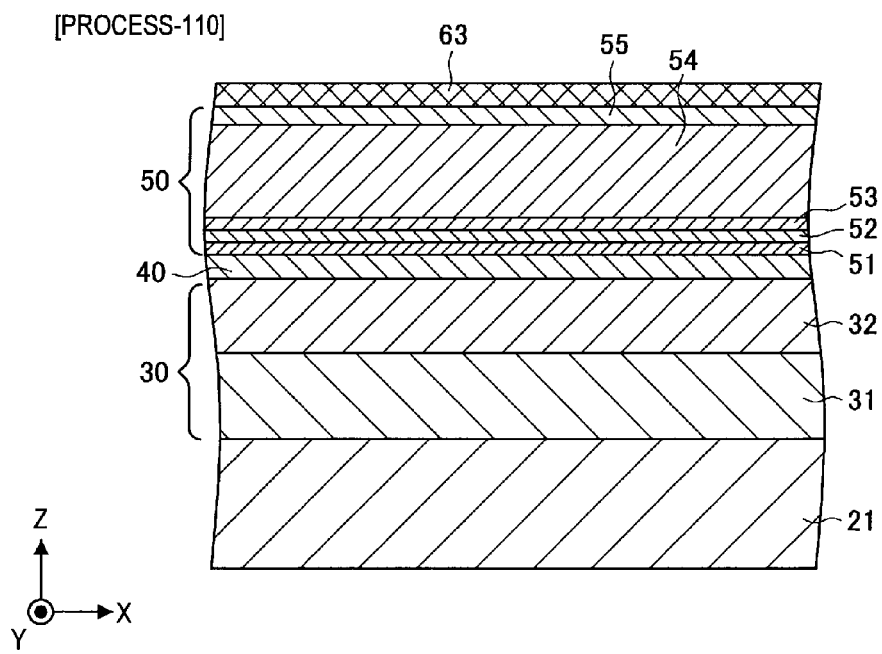
FIG. 14B is a schematic partial sectional view of a substrate or the like to illustrate a manufacturing method of the mode-locked semiconductor laser device of Example 1.
Figure 15A:
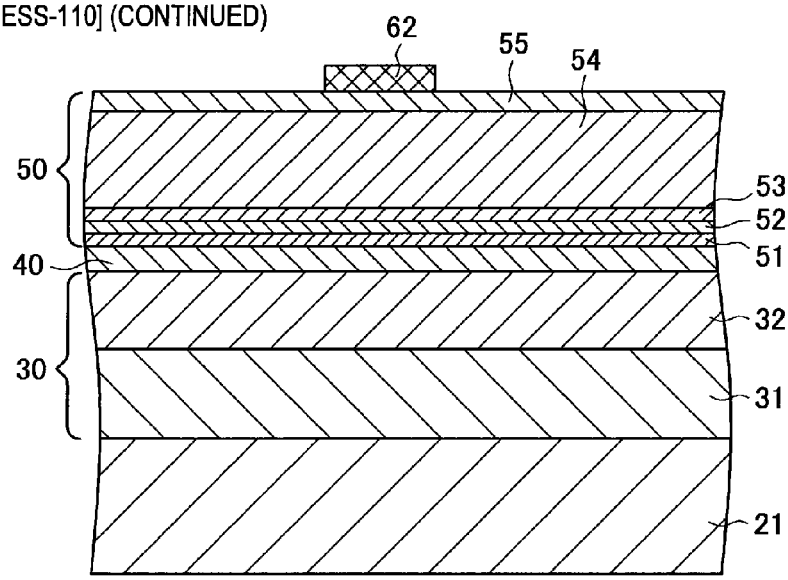
FIG. 15A is continued from FIG. 14B and is a schematic partial sectional view of the substrate and the like to illustrate the manufacturing method of the mode-locked semiconductor laser device of Example 1.
Figure 15B:
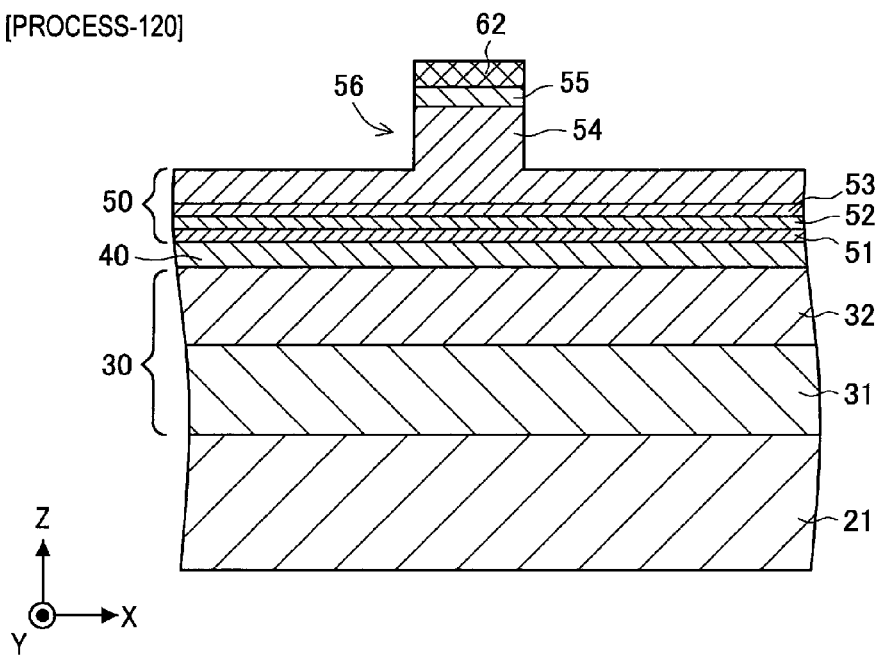
FIG. 15B is continued from FIG. 14B and is a schematic partial sectional view of the substrate and the like to illustrate the manufacturing method of the mode-locked semiconductor laser device of Example 1.

A laminated structure in which the first compound semiconductor layer 30 having the first conductive type (n-type conductive type) and composed of a GaN base compound semiconductor, the third compound semiconductor layer (active layer) 40 constituting the emission region (gain region) 41 and the saturable absorption region 42 composed of a GaN base compound semiconductor, and the second compound semiconductor layer 50 having the second conductive type (p-type conductive type) that is different from the first conductive type and composed of a GaN base compound semiconductor are successively laminated is first formed on a substrate, concretely a (0001) plane of the n-type GaN substrate 21 based on the known MOCVD method (see FIG. 14A).

[Process—110]

Subsequently, the second electrode 62 in a belt shape is formed on the second compound semiconductor layer 50. More specifically, after forming a Pd layer 63 all over the second compound semiconductor layer 50 based on the vacuum evaporation method (see FIG. 14B), a resist layer for etching in a belt shape is formed on the Pd layer 63 based on photolithography technology. Then, after the Pd layer 63 not covered with the resist layer for etching being removed using aqua regia, the resist layer for etching is removed. In this way, the structure shown in FIG. 15A may be obtained. Incidentally, the second electrode in a belt shape mat be formed on the second compound semiconductor layer 50 based on the lift-off method.

[Process—120]

Next, a ridge structure is formed by etching at least a portion of the second compound semiconductor layer 50 (in Example 1, by etching a portion of the second compound semiconductor layer 50) using the second electrode 62 as an etching mask. More specifically, a portion of the second compound semiconductor layer 50 is etched using the second electrode 62 as an etching mask based on the RIE method using a Cl$_2$ gas. In this way, the structure shown in FIG. 15B may be obtained. Thus, a ridge structure is formed by the self alignment using the second electrode 62 patterned in a belt shape as an etching mask and therefore, the second electrode 62 and the ridge structure will not be misaligned.

[Process—130]

Subsequently, a resist layer 64 to form a separation groove in the second electrode 62 is formed (see FIG. 16). Reference numeral 65 is an opening provided in the resist layer 64 to form a separation groove. Next, the separation groove 62C is formed in the second electrode 62 by wet etching using the resist layer 64 as a wet etching mask to separate the second electrode 62 into the first portion 62A and the second portion 62B by the separation groove 62C. More specifically, aqua regia is used as an etchant and the separation groove 62C is formed in the second electrode 62 by soaking the whole second electrode 62 in aqua regia for about 10 seconds. Then, the resist layer 64 is subsequently removed. In this way, the structure shown in FIGS. 1 and 2 may be obtained. Thus, in contrast to dry etching, optical or electric characteristics of the second compound semiconductor layer 50 are not degraded by adopting wet etching. Therefore, emission characteristics of a mode-locked semiconductor laser device will not be degraded. If dry etching is adopted, the internal loss $\alpha_i$ of the second compound semiconductor layer 50 increases, which could lead to a rise in threshold voltage or degradation in optical output. If the etching rate of the second electrode 62 is $ER_0$ and that of the laminated structure is $ER_1$, "$ER_0/ER_1 \approx 1 \times 10^2$" is obtained. Thus, there is a high etching selection ratio between the second electrode 62 and the second compound semiconductor layer 50 and therefore, the second electrode 62 may reliably be etched without etching the laminated structure (or only slightly if etched).

[Process—140]

Subsequently, the n-side electrode 61 is formed and the substrate is cleaved and further packaged to produce the mode-locked semiconductor laser device 10.

Generally, a resistance R (Ω) of a semiconductor layer may be represented as shown below by using the value of resistivity ρ of a material constituting the semiconductor layer, the length $X_0$ (m) of the semiconductor layer, the cross section S (m$^2$) of the semiconductor layer, the carrier density n (cm$^{-3}$), the amount of charge e (C), and the mobility μ (m$^2$/Vs):

$$R=(\rho \cdot X_0)/S=X_0/(n \cdot e \cdot \mu \cdot S)$$

When compared with a p-type GaAs base semiconductor, the mobility of a p-type GaN base semiconductor is smaller by two orders of magnitude or more, which is likely to increase the electric resistance value. Thus, it is clear from the above formula that the electric resistance value of a semiconductor laser device having a ridge structure whose cross section is small such as the width 1.5 µm and the height 0.35 µm will be a large value.

Figure 12:
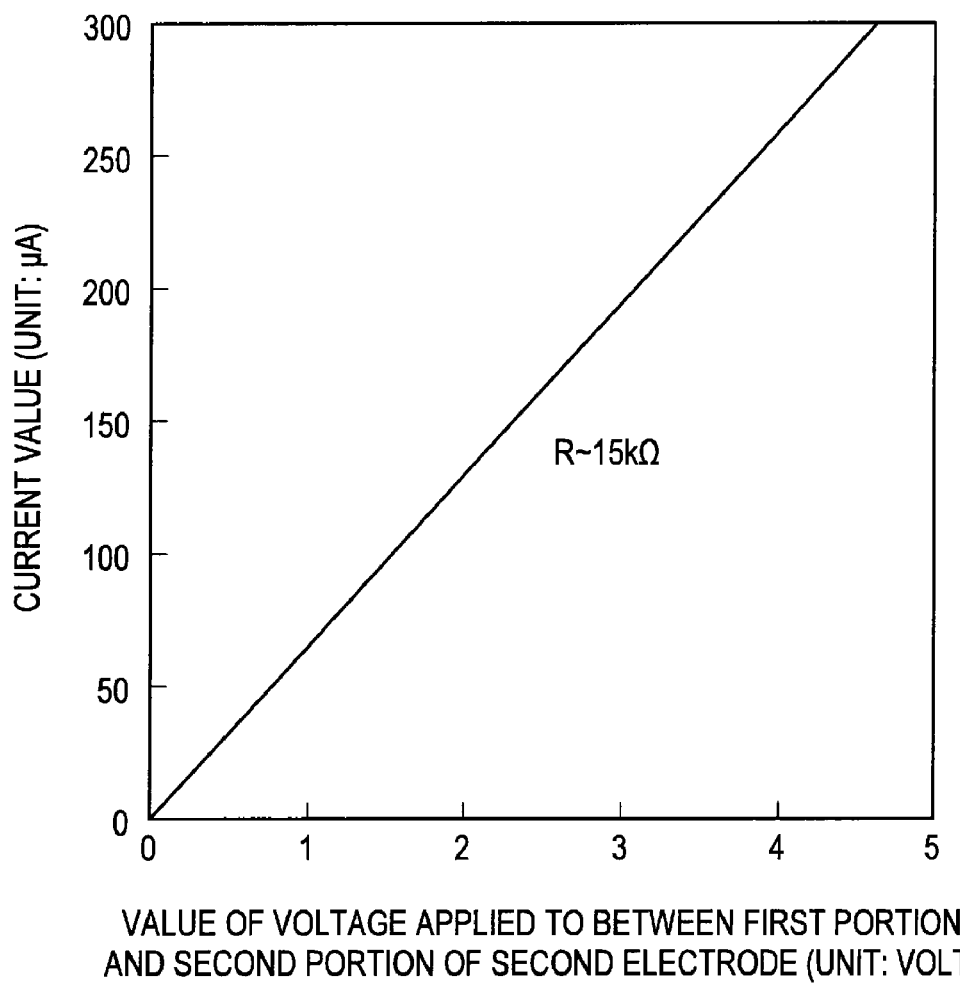
FIG. 12 is a graph showing a result of measuring the value of electric resistance between a first portion and a second portion of a second electrode of the mode-locked semiconductor laser device obtained of Example 1.

FIG. 12 shows a result of measuring the electric resistance value between the first portion 62A and the second portion 62B of the second electrode 62 of the produced mode-locked semiconductor laser device 10 of Example 1 by the four-terminal method. When the width of the separation groove 62C is 20 µm, the electric resistance value between the first portion 62A and the second portion 62B of the second electrode 62 is 15 kΩ.

In the produced mode-locked semiconductor laser device 10 of Example 1, a forward bias state is created by passing a DC current from the first portion 62A of the second electrode 62 to the first electrode 61 via the emission region 41 and an electric field is applied to the saturable absorption region 42 by applying the reverse bias voltage $V_{sa}$ to between the first electrode 61 and the second portion 62B of the second electrode 62 to carry out mode-locked driving.

Moreover, the value of electric resistance between the first portion 62A and the second portion 62B of the second electrode 62 is 10 times the value of electric resistance between the second electrode 62 and the first electrode 61 or more or $1 \times 10^2 \Omega$ or more. Therefore, the flow of leakage current from the first portion 62A of the second electrode 62 to the second portion 62B may reliably be suppressed and, as a result, the emission region 41 may be put into a forward bias state and besides, the saturable absorption region 42 may reliably be put into a reverse bias state so that a single mode self-pulsation operation and a mode-locked operation may reliably be caused.

Example 2

Figure 3B:
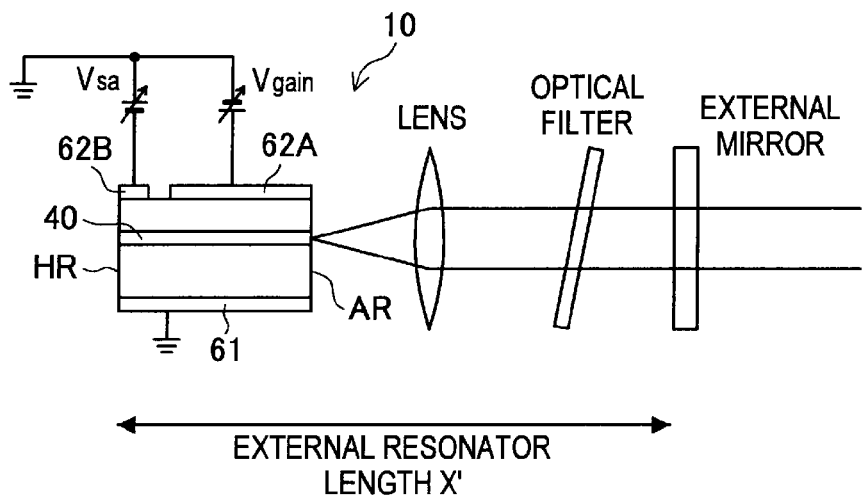
FIG. 3B is a diagram schematically showing a system that carries out mode-locked driving by constituting an external resonator from a mode-locked semiconductor laser device of Example 2.
Figure 4A:
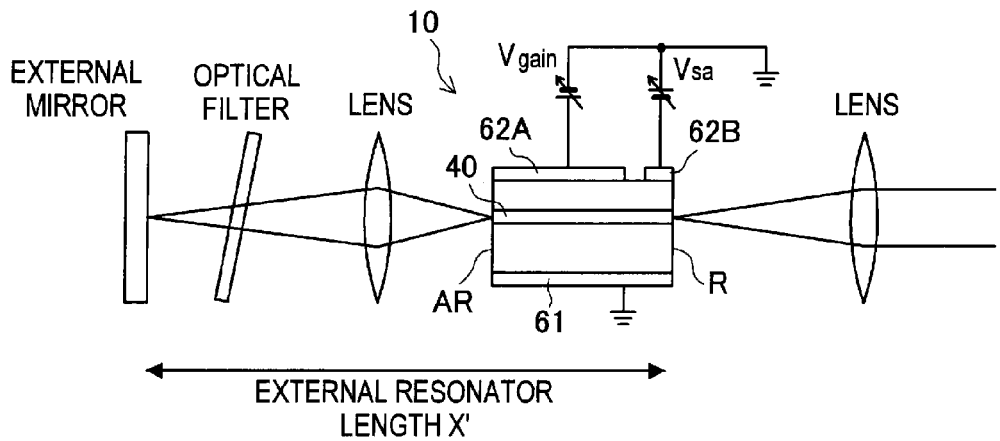
FIG. 4A is a diagram schematically showing a system that carries out mode-locked driving by constituting an external resonator from the mode-locked semiconductor laser device of Example 2.
Figure 4B:
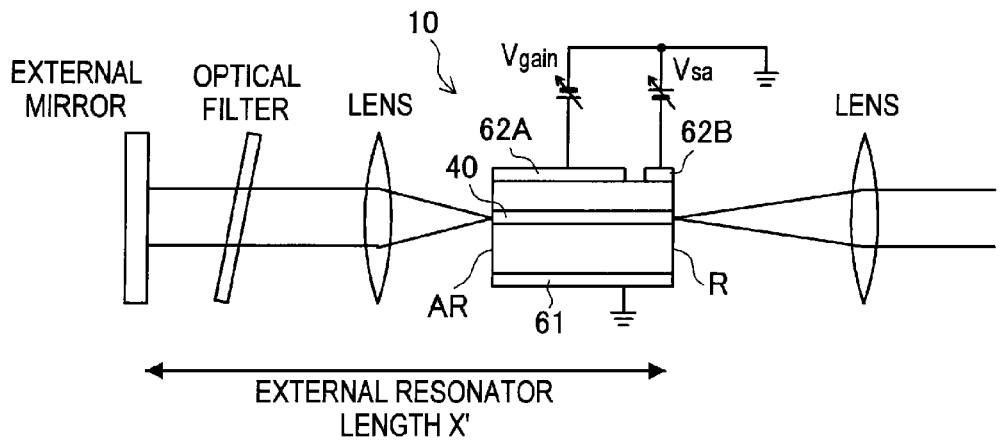
FIG. 4B is a diagram schematically showing a system that carries out mode-locked driving by constituting an external resonator from the mode-locked semiconductor laser device of Example 2.

Example 2 is a modification of Example 1. FIGS. 3B, 4A, and 4B show an example in which an external resonator is configured from a mode-locked semiconductor laser device of example 2.

Also in a collimator type external resonator shown in FIG. 3B, an external resonator is configured by an end face of the mode-locked semiconductor laser device in which a high reflection coat layer (HR) is formed on the side of the saturable absorption region and an external mirror and an optical pulse is extracted from the external mirror. An antireflection coat layer (AR) is formed on an end face (light emitting end face) of the mode-locked semiconductor laser device on the side of the emission region (gain region). The same driving conditions and the like as those in Table 3 shown above may be set for the mode-locked semiconductor laser device of Example 2 shown in FIG. 3B.

In an external resonator shown in FIGS. 4A and 4B, on the other hand, an external resonator is configured by an end face of the mode-locked semiconductor laser device in which a reflection coat layer (R) is formed on the side of the saturable absorption region (light emitting end face) and an external mirror and an optical pulse is extracted from the saturable absorption region 42. An antireflection coat layer (AR) is formed on an end face of the mode-locked semiconductor laser device on the side of the emission region (gain region). The example shown in FIG. 4A is of condensing type and the example shown in FIG. 4B is of collimator type. The same driving conditions and the like as those in Table 3 shown above may be set for the mode-locked semiconductor laser devices of Example 2 shown in FIGS. 4A and 4B. However, the reflection coat layer (R) may be set as following Table 4.

TABLE 4

[Reflection coat layer (R)]
0 < reflectance $R_R$ (%) < 100

More specifically, the reflectance is set as $R_R$=20%. The same configuration and structure of the mode-locked semiconductor laser device and the like in Example 1 may be adopted as those of the mode-locked semiconductor laser device and the like in Example 2 and thus, a detailed description thereof is not repeated.

Example 3

Figure 4C:
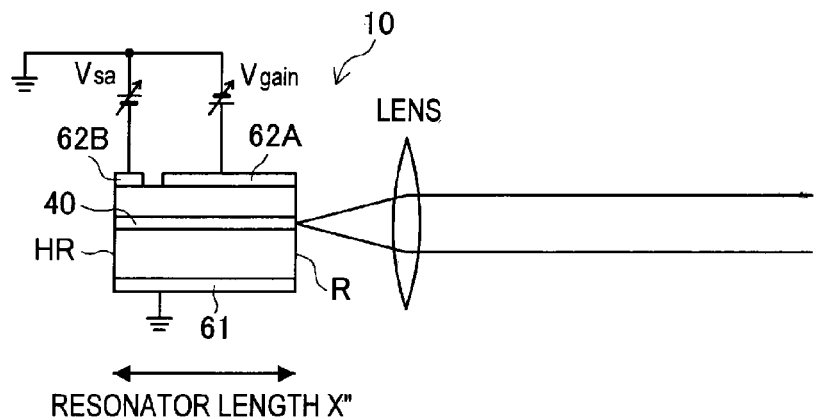
FIG. 4C is a diagram schematically showing a system that carries out mode-locked driving using a mode-locked semiconductor laser device of Example 3.

Example 3 is also a modification of Example 1 and in Example 3, as shown in FIG. 4C, the mode-locked semiconductor laser is of monolithic type. The same driving conditions and the like as those in Table 3 shown above may be set for the mode-locked semiconductor laser device of Example 3. The same configuration and structure of the mode-locked semiconductor laser device and the like in Example 1 may be adopted as those of the mode-locked semiconductor laser device and the like in Example 3 and thus, a detailed description thereof is not repeated.

Example 4

Figure 5:
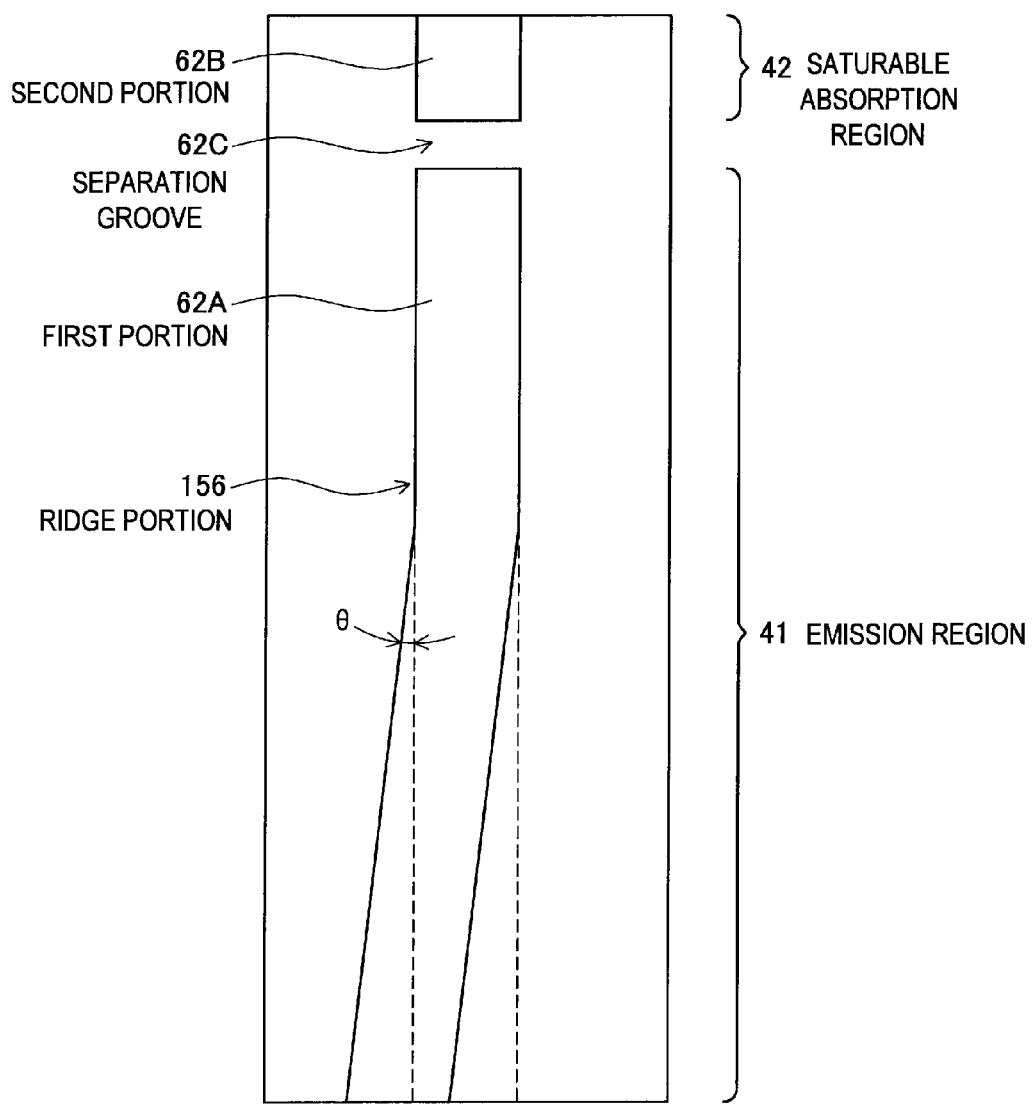
FIG. 5 is a schematic diagram of a ridge portion in the mode-locked semiconductor laser device in Example 4 when viewed from above.

Example 4 is also a modification of Example 1 and a mode-locked semiconductor laser device of Example 4 is a mode-locked semiconductor laser device of a separate confinement heterostructure of oblique ridge stripe type having an oblique waveguide. FIG. 5 shows a schematic diagram when a ridge portion 156 in a mode-locked semiconductor laser device of Example 4 is viewed from above. The mode-locked semiconductor laser device of Example 4 has a structure in which two linear ridge portions are combined and it is desirable that the value of the angle θ at which the two ridge portions intersect be 0<θ≦10 (degrees), preferably 0<θ≦6 (degrees). By adopting the oblique ridge stripe type, the reflectance of the end face with antireflection coat may be brought closer to the ideal value of 0% and, as a result, generation of an optical pulse that revolves inside the semiconductor laser may be prevented so that generation of sub optical pulses accompanying a main optical pulse may advantageously be suppressed. A mode-locked semiconductor laser device of oblique ridge stripe type of Example 4 may be applied to Example 1 to Example 3. The same configuration and structure of the mode-locked semiconductor laser device and the like in Example 1 may be adopted as those of the mode-locked semiconductor laser device and the like in Example 4 and thus, a detailed description thereof is not repeated.

Example 5

Figure 6A:
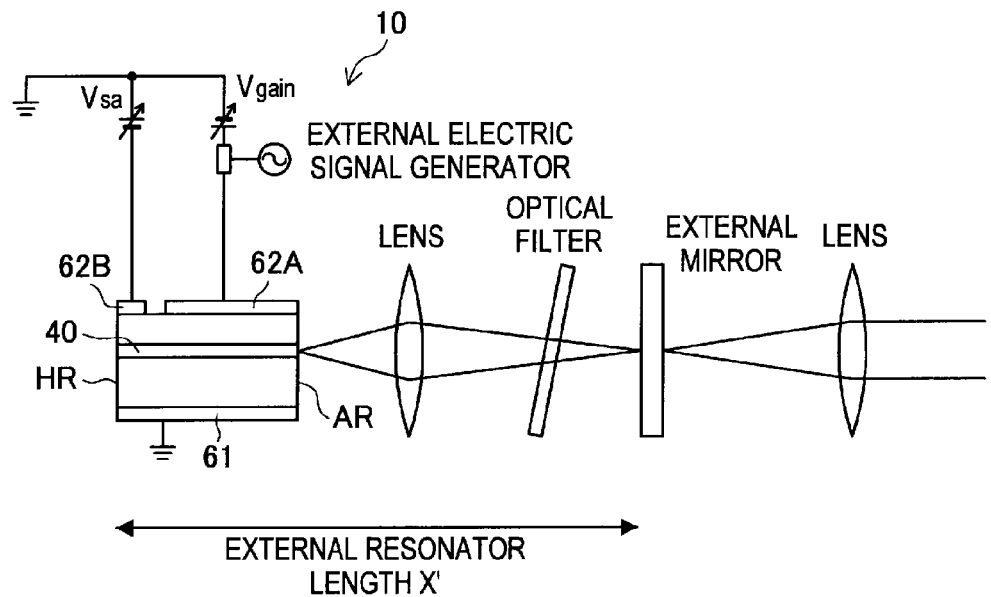
FIG. 6A is a diagram schematically showing a system that carries out mode-locked driving using a mode-locked semiconductor laser device of Example 5.

Example 5 is also a modification of Example 1 and in Example 5, a current is passed from the second electrode 62 to the first electrode 61 via the emission region 41 and also an external electric signal (RMS jitter $\Delta_{signal}$) is superimposed on the first electrode 61 from the second electrode 62 via the emission region 41. FIG. 6A schematically shows a system that carries out mode-locked driving using a mode-locked semiconductor laser device of Example 5. The external electric signal is sent out from a known external electric signal generator to the second electrode 62. Accordingly, an optical pulse and the external electric signal may be synchronized. That is, RMS timing jitter $\Delta T_{MLLD}$ may be suppressed to the level below. $\Delta_{signal} \leq \Delta t_{MLLD}$ The same driving conditions and the like as those in Table 3 shown above may be set for the mode-locked semiconductor laser device of Example 5 shown in FIG. 6A. It is desirable that a maximum voltage value $V_{p-p}$ (unit: volt) of the external electric signal satisfy $0 < V_{p-p} \leq 10$, preferably $0 < V_{p-p} \leq 3$. It is also desirable that a frequency $f_{signal}$ of the external electric signal and a repetition frequency $f_{MLLD}$ of an optical pulse train satisfy $0.99 \leq f_{signal}/f_{MLLD} \leq 1.01$.

More specifically, as an example, the following settings are made for Example 5

Figure 13A:
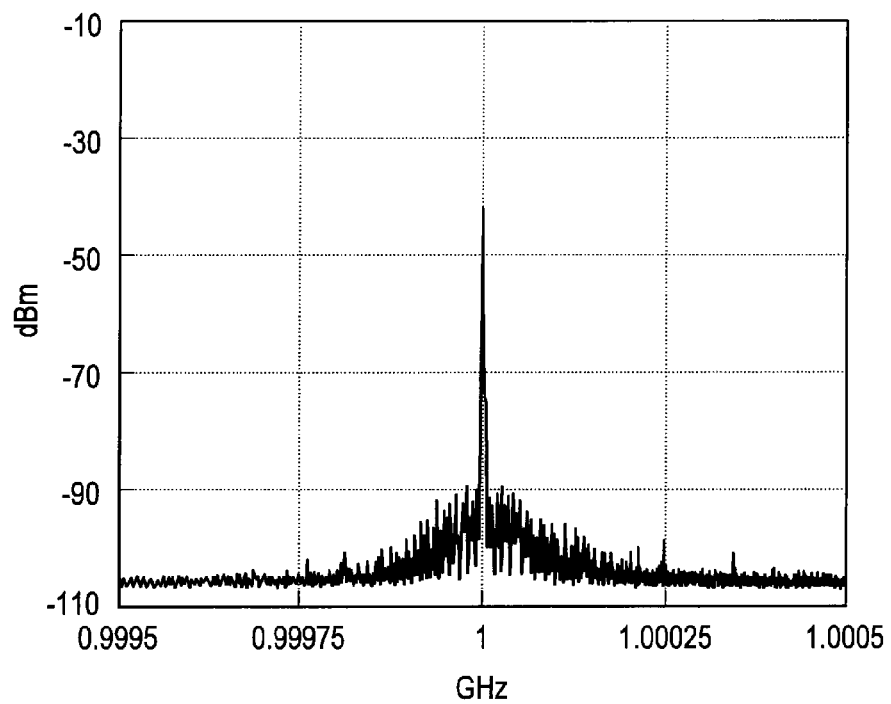
FIG. 13A is a graph showing a result of measuring RF spectra of Example 5.
Figure 13B:
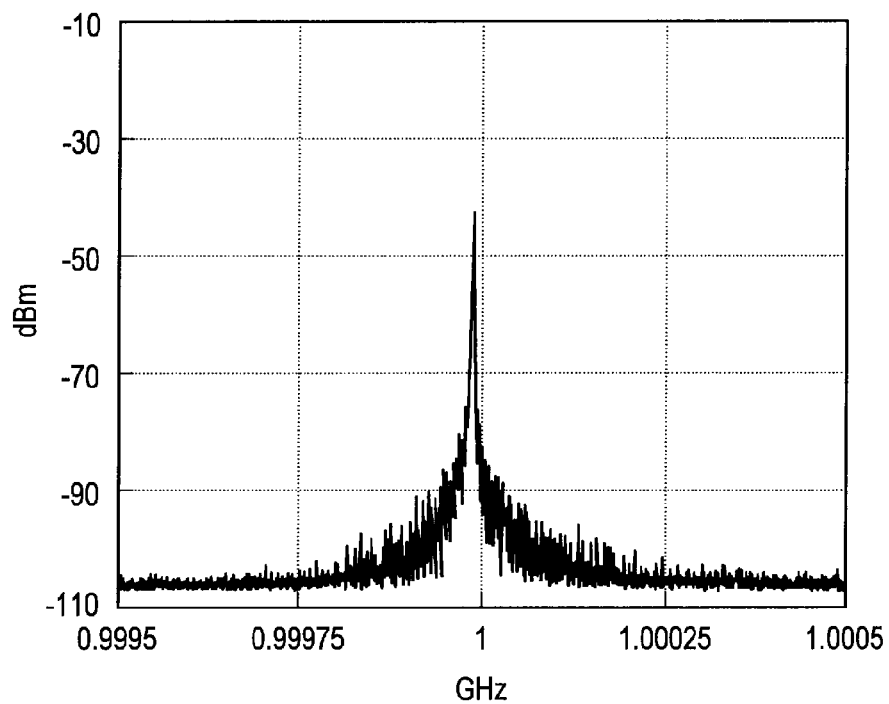
FIG. 13B is a graph showing a result of measuring RF spectra of Reference Example 5.

$I_{gain}$=120 mA
$I_{th}$=45 mA
Reverse bias voltage V=−11 (V)
Reflectance $R_{HR}$=95(%)
Reflectance $R_{AR}$=0.3(%)
Transmittance $T_{BPF}$=90(%)
Half-width $T_{BPF}$=1 nm
Peak wavelength $\lambda_{BPF}$=410 nm
Reflectance $R_{OC}$=20%
External resonator length X'=150 mm
$V_{p-p}$=2.8 V
$f_{signal}$=1 GHz
$f_{MLLD}$=1 GHz
$\Delta_{signal}$=1 picosecond
$\Delta t_{MLLD}$=1.5 picosecond In Reference Example 5, on the other hand, a current is passed from the second electrode 62 to the first electrode 61 via the emission region 41 without an external electric signal being superimposed on the first electrode 61 from the second electrode 62 via the emission region 41. Then, the RF spectrum is measured. FIGS. 13A and 13B show measurement results of Example 5 and Reference Example 5. In Reference Example 5, the reflectance is set as $R_{OC}$=50%. Other data settings are the same as those in Example 5.

FIGS. 13A and 13B show that when compared with Reference Example 5, the area of base components of the RF spectrum is reduced in Example, which indicates that when compared with Reference Example 5, Example 5 is the driving method causing less phase noise and timing jitter.

The same configuration and structure of the mode-locked semiconductor laser device and the like in Example 1 to Example 4 may be adopted as those of the mode-locked semiconductor laser device and the like in Example 5 and thus, a detailed description thereof is not repeated.

Example 6

Figure 6B:
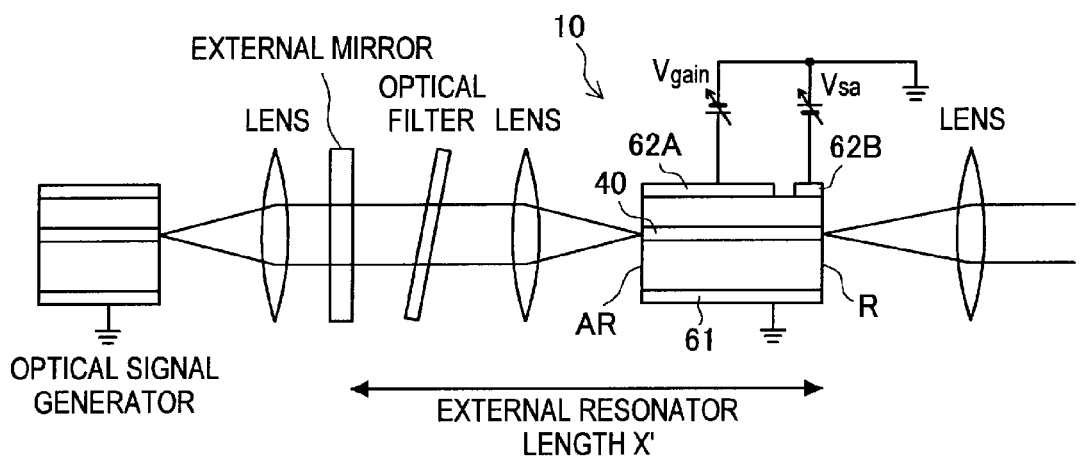
FIG. 6B is a diagram schematically showing a system that carries out mode-locked driving using a mode-locked semiconductor laser device of Example 6.

Example 6 is also a modification of Example 1 and in Example 6, an optical signal is caused to enter a laminated structure from an end face thereof. FIG. 6B schematically shows a system that carries out mode-locked driving using a mode-locked semiconductor laser device of Example 6. An optical signal (RMS jitter: $\Delta t_{opto}$) is emitted from an optical signal generator composed of a semiconductor laser device and enters one end face of the laminated structure via a lens, external mirror, optical filter, and lens. Accordingly, an optical pulse and the optical signal may be synchronized. That is, RMS timing jitter $\Delta t_{MLLD}$ may be suppressed to the level below. $\Delta_{opto} \leq \Delta t_{MLLD}$ The same configuration and structure of the mode-locked semiconductor laser device and the like in Example 1 to Example 4 may be adopted as those of the mode-locked semiconductor laser device and the like in Example 6 and thus, a detailed description thereof is not repeated.

The configurations of semiconductor laser devices and configurations of structures described in the examples are only illustrations and may be changed if necessary. Various values are shown in the examples, but these values are also only illustrations and if, for example, the specification of the semiconductor laser device to be used changes, also such values naturally change. For example, a laminated structure has a lower metallic layer composed of palladium (Pd) whose thickness is 20 nm and an upper metallic layer composed of nickel (Ni) whose thickness is 200 nm. Incidentally, in wet etching by aqua regia, the etching rate of nickel is about 1.25 times that of palladium.

In the above examples, the mode-locked semiconductor laser device 10 is provided on the C plane, which is a polar plane of the n-type GaN substrate 21, or {0001} plane, but the mode-locked semiconductor laser device 10 may alternatively be provided on an A plane, which is a {11-20} plane, an M plane, which is a {1-100} plane, a non-polar plane such as a {1-102} plane, or a {11-2n} plane containing a {11-24} plane and a {11-22} plane or a semi-polar plane such as a {10-11} plane and {10-12} plane and accordingly, even if piezo polarization or spontaneous polarization arises in the third compound semiconductor layer of the mode-locked semiconductor laser device 10, piezo polarization will arise in the thickness direction of the third compound semiconductor layer and instead, piezo polarization arises in a direction substantially perpendicular to the thickness direction of the third compound semiconductor layer so that adverse effects originating from piezo polarization or spontaneous polarization may be eliminated. The {11-2n} plane means a non-polar plane forming 40 degrees with respect to approximately the C plane. When the mode-locked semiconductor laser device 10 is provided on a non-polar plane or a semi-polar plane, restrictions of the thickness of the well layer (1 nm or more and 10 nm or less) and restrictions of the impurity doping density of the barrier layer ($2 \times 10^{18}$ cm$^{-3}$ or more and $1 \times 10^{20}$ cm$^{-3}$ or less) may be eliminated.

Figure 8:
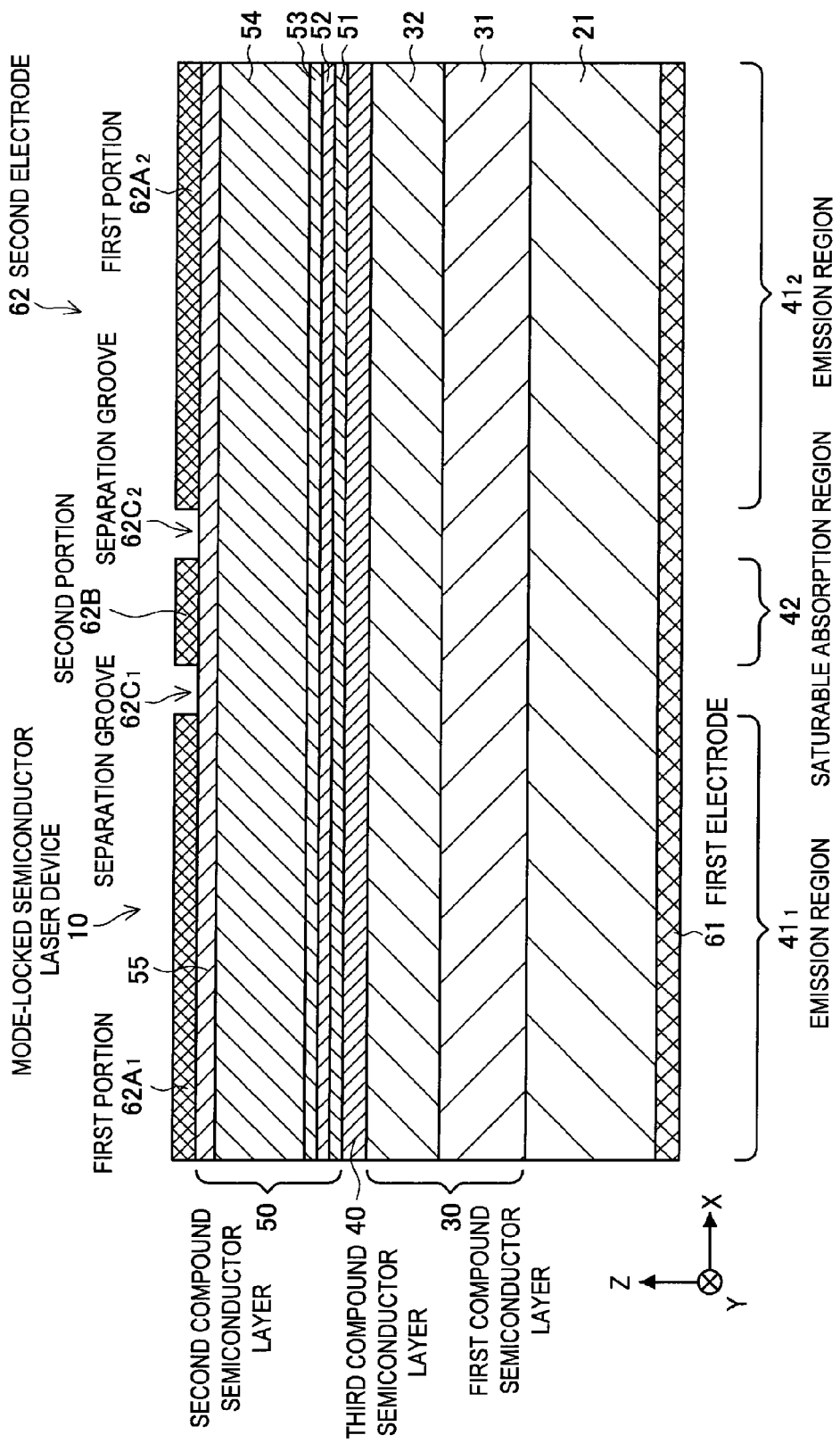
FIG. 8 is a schematic sectional view along the direction in which another modified resonator of the mode-locked semiconductor laser device of Example 1 extends.

The number of the emission region 41 and that of the saturable absorption region 42 are not limited to one. FIG. 7 shows a schematic end face diagram of a mode-locked semiconductor laser device in which one first portion 62A of the second electrode and two second portions 62B$_1$ and 62B$_2$ of the second electrode are provided. In this mode-locked semiconductor laser device, one edge of the first portion 62A is opposite to one second portion 62B$_1$ sandwiching one separation groove 62C$_1$ therebetween, and the other edge of the first portion 62A is opposite to the other second portion 62B$_2$ sandwiching the other separation groove 62C$_2$ therebetween. Moreover, the one emission region 41 is sandwiched between two saturable absorption regions 42$_1$ and 42$_2$. FIG. 8 shows a schematic end face diagram of a mode-locked semiconductor laser device in which two first portions 62A$_1$ and 62A$_2$ of the second electrode and one second portion 62B of the second electrode are provided. In this mode-locked semiconductor laser device, one edge of the second portion 62B is opposite to one first portion 62A$_1$ sandwiching one separation groove 62C$_1$ therebetween, and the other edge of the second portion 62B is opposite to the other first portion 62A$_2$ sandwiching the other separation groove 62C$_2$ therebetween. Moreover, the one saturable absorption region 42 is sandwiched between two emission regions 41$_1$ and 41$_2$.

It should be understood that various changes and modifications to the presently preferred embodiments described herein will be apparent to those skilled in the art. Such changes and modifications can be made without departing The invention is claimed as follows:

1. A method of driving a semiconductor laser device comprising:
   (a) a laminated structure in which a first compound semiconductor layer having a first conductive type and composed of a GaN base compound semiconductor, a third compound semiconductor layer having an emission region and a saturable absorption region composed of the GaN base compound semiconductor, and a second compound semiconductor layer having a second conductive that is different from the first conductive type and composed of the GaN base compound semiconductor are successively laminated;
   (b) a second electrode formed on the second compound semiconductor layer; and
   (c) a first electrode electrically connected to the first compound semiconductor layer,
   wherein the laminated structure is formed on a compound semiconductor substrate having polarity,
   the third compound semiconductor layer includes a quantum well structure having a well layer and a barrier layer,
   the well layer has a depth of 1 nm or more and 10 nm or less,
   the barrier layer has an impurity doping density of $2 \times 10^{18}$ cm$^{-3}$ or more and $1 \times 10^{20}$ cm$^{-3}$ or less, and
   generating an optical pulse in the emission region by passing a current from the second electrode to the first electrode via the laminated structure, and
   wherein the second electrode is separated into at least a first portion and a second portion by a separation groove, and a value of electric resistance between the first portion and the second portion of the second electrode is $1 \times 10^2 \Omega$ or more.

2. The method of driving a mode-locked semiconductor laser device according to claim 1,
   wherein the first portion creates a forward bias state by passing the current to the first electrode via the emission region and the second portion applies an electric field to the saturable absorption region by the separation groove, and
   the forward bias state is created by passing the current from the first portion of the second electrode to the first electrode via the emission region and the electric field is applied to the saturable absorption region by applying a voltage to between the first electrode and the second portion of the second electrode.

3. The method of driving a mode-locked semiconductor laser device according to claim 1,
   wherein the separation groove that separates the second electrode into the first portion and the second portion has a width of 1 μm or more.

4. The method of driving a mode-locked semiconductor laser device according to claim 1,
   wherein the saturable absorption region has a length shorter than that of the emission region.

5. The method of driving a mode-locked semiconductor laser device according to claim 2,
   wherein the current is passed from the second electrode to the first electrode via the emission region and also an external electric signal is superimposed on the first electrode from the second electrode via the emission region.

6. The method of driving a mode-locked semiconductor laser device according to claim 1,
   wherein an optical signal is caused to enter the laminated structure from an end face.

7. The method of driving a mode-locked semiconductor laser device according to claim 1,
   wherein an impurity with which the barrier layer is doped is silicon.

8. The method of driving a mode-locked semiconductor laser device according to claim 1,
   wherein a separate confinement heterostructure of ridge stripe type is included.

9. The method of driving a mode-locked semiconductor laser device according to claim 1,
   wherein a separate confinement heterostructure of oblique ridge stripe type is included.

10. A semiconductor laser device comprising:
    (a) a laminated structure in which a first compound semiconductor layer having a first conductive type and composed of a GaN base compound semiconductor, a third compound semiconductor layer having an emission region and a saturable absorption region composed of the GaN base compound semiconductor, and a second compound semiconductor layer having a second conductive that is different from the first conductive type and composed of the GaN base compound semiconductor are successively laminated;
    (b) a second electrode foimed on the second compound semiconductor layer; and
    (c) a first electrode electrically connected to the first compound semiconductor layer,
    wherein the laminated structure is formed on a compound semiconductor substrate having polarity,
    the third compound semiconductor layer includes a quantum well structure having a well layer and a barrier layer,
    the well layer has a depth of 1 nm or more and 10 nm or less,
    the barrier layer has an impurity doping density of $2 \times 10^{18}$ cm$^{-3}$ or more and $1 \times 10^{20}$ cm$^{-3}$ or less, and
    an optical pulse develops in the emission region by a current being passed from the second electrode to the first electrode via the laminated structure, and
    wherein the second electrode is separated into at least a first portion and a second portion by a separation groove, and a value of electric resistance between the first portion and the second portion of the second electrode is $1 \times 10^2 \Omega$ or more.

* * * * *